United States Patent
Hayashi et al.

(10) Patent No.: US 7,488,526 B2
(45) Date of Patent: *Feb. 10, 2009

(54) SPUTTERING TARGET AND MANUFACTURING METHOD THEREFOR, AND OPTICAL RECORDING MEDIUM AND MANUFACTURING METHOD THEREFOR

(75) Inventors: Yoshitaka Hayashi, Yokohama (JP); Noboru Sasa, Kawasaki (JP); Toshishige Fujii, Yokohama (JP); Masayuki Fujiwara, Yokohama (JP)

(73) Assignee: Ricoh Company, Ltd., Tokyo (JP)

( * ) Notice: Subject to any disclaimer, the term of this patent is extended or adjusted under 35 U.S.C. 154(b) by 12 days.

This patent is subject to a terminal disclaimer.

(21) Appl. No.: 11/602,629

(22) Filed: Nov. 20, 2006

(65) Prior Publication Data

US 2007/0114129 A1    May 24, 2007

(30) Foreign Application Priority Data

| Nov. 22, 2005 | (JP) | ............................. 2005-337654 |
| Nov. 24, 2005 | (JP) | ............................. 2005-339102 |
| Feb. 10, 2006 | (JP) | ............................. 2006-034370 |
| Feb. 14, 2006 | (JP) | ............................. 2006-037099 |

(51) Int. Cl.
*B32B 3/02* (2006.01)

(52) U.S. Cl. ................. 428/64.4; 428/64.5; 430/270.13; 204/192.1

(58) Field of Classification Search ................. 428/64.4, 428/64.5; 430/270.13; 204/192.1
See application file for complete search history.

(56) References Cited

U.S. PATENT DOCUMENTS

| 4,405,706 | A  | * | 9/1983  | Takahashi et al. | ....... 430/270.12 |
| 6,319,368 | B1 | * | 11/2001 | Ide et al.       | ................. 204/192.26 |
| 6,610,380 | B2 | * | 8/2003  | Kitaura et al.   | .............. 428/64.1 |
| 6,713,148 | B1 | * | 3/2004  | Hsu et al.       | ................... 428/64.1 |
| 6,764,736 | B2 | * | 7/2004  | Kitaura et al.   | .............. 428/64.1 |
| 6,933,032 | B2 | * | 8/2005  | Sasa et al.      | ................... 428/64.1 |
| 2005/0244753 | A1 | * | 11/2005 | Mishima et al. | ......... 430/270.12 |
| 2006/0003136 | A1 | * | 1/2006  | Sasa et al.     | ................... 428/64.4 |

FOREIGN PATENT DOCUMENTS

| JP | 2-42899   | 9/1990  |
| JP | 2-265052  | 10/1990 |
| JP | 5-36142   | 2/1993  |
| JP | 6-184740  | 7/1994  |
| JP | 6-330297  | 11/1994 |
| JP | 7-90573   | 4/1995  |
| JP | 7-180045  | 7/1995  |
| JP | 8-67980   | 3/1996  |
| JP | 2578815   | 7/1996  |
| JP | 2769153   | 4/1998  |
| JP | 11-92922  | 4/1999  |

(Continued)

*Primary Examiner*—Elizabeth Mulvaney
(74) *Attorney, Agent, or Firm*—Cooper & Dunham LLP

(57) ABSTRACT

To provide a sputtering target used for the formation of a recording layer of a recordable optical recording medium, wherein the sputtering target contains Bi and Fe and the packing density of the sputtering target is greater than 96%, and a recordable optical recording medium manufactured by using the sputtering target, which the recordable optical recording medium is capable of high-density recording even in the blue laser's wavelength range.

17 Claims, 2 Drawing Sheets

FOREIGN PATENT DOCUMENTS

| | | |
|---|---|---|
| JP | 11-193457 | 7/1999 |
| JP | 3098204 | 8/2000 |
| JP | 2000-264731 | 9/2000 |
| JP | 2002-208180 | 7/2002 |
| JP | 2003-3222 | 1/2003 |
| JP | 2003-048375 * | 2/2003 |
| JP | 2005-108396 | 4/2005 |
| JP | 2006-97126 | 4/2006 |

* cited by examiner

SPUTTERING TARGET AND MANUFACTURING METHOD THEREFOR, AND OPTICAL RECORDING MEDIUM AND MANUFACTURING METHOD THEREFOR

BACKGROUND OF THE INVENTION

1. Field of the Invention

The present invention relates to a sputtering target used for the deposition of an oxide recording layer constituting an optical recording medium and to a manufacturing method for the same. The present invention also relates to an optical recording medium manufactured by using the sputtering target, particularly a recordable optical recording medium capable of high-density recording even in the blue laser's wavelength range and to a manufacturing method for the same.

2. Description of the Related Art

Blue lasers that enable ultrahigh-density recording have been rapidly developed for the provision of recordable optical recording media capable of recording and reproducing at wavelengths equal to or shorter than those of blue lasers. Correspondingly, recordable optical recording media supporting such blue lasers have also been developed.

The inventors of this application discloses in Japanese Patent Application Laid-Open (JP-A) No. 2005-108396 that a recordable optical recording medium using a film containing Bi, Fe, and O shows excellent characteristics, and that the sputtering method is used for the formation of this film. The present inventors also disclose a sputtering target containing Bi, Fe, and O in JP-A No. 2006-097126.

The sputtering method has been widely known as one of the vapor growth methods for depositing a thin film, and has been applied to industrial manufacture of thin films. In the sputtering method a target material containing the same ingredients as a film to be deposited is prepared, and argon ions generated via grow discharge are bombarded into the target material to kick out its constituent ions, allowing them to be deposited onto a substrate to form a film. Vapor deposition methods are not preferable because oxides generally have high melting points; therefore, radio-frequency sputtering is often used that involves application of high-frequency waves.

As a known technology, for example, JP-A No. 11-92922 discloses a Bi oxide-based sputtering target used for the deposition of a dielectric film, but this patent literature fails to describe an Fe-containing sputtering target. For this reason, the disclosure of the patent literature provides no basis for accomplishing the present invention.

In addition, Japanese Patent Application Publication (JP-B) No. 02-42899 discloses s sputtering target used to form a thin film made of $Bi_3Fe_5O_{12}$, but the invention disclosed in the patent literature differs from the present invention in that the former intends to produce a film with a so-called garnet structure that imparts high magnetooptical effects. Moreover, this patent literature fails to describe a relationship between packing density and media characteristics.

Japanese Patent (JP-B) No. 2769153 discloses a sputtering target for thin films for recording media, which the sputtering target consists at least of Te, Ge and Sb and has a packing density of 80% or more. This literature also describes the fact that, if packing density of 80% or more is achieved, there is no change in the composition after sputtering the target for 1 hour, i.e., it is possible to obtain the same composition for a long period of time after 1-hour sputtering, while presenting comparison data for 70%, 80%, and 90% packing densities. The composition of this sputtering target, however, is different from that of the sputtering target of the present invention and provides no detailed comparison data for packing density of greater than 90%. Thus, the patent literature provides no basis for establishing that there is a threshold in packing density at which media characteristics change—the present inventors have established that such a threshold exists at 96%, a percentage almost close to 100%.

A problem associated with oxide targets used in the sputtering method is that their film deposition rates are low compared to other species such as metals and the like, and that they are prone to fracture.

To solve this problem, the present inventors demonstrated in JP-A No. 2006-097126 that reduced film deposition time, high target strength, and desired film composition can be realized by setting packing density to within the range of 65% to 96%.

Their extensive studies have revealed that continuous manufacture of optical recording media using the oxide target disclosed in JP-A No. 2006-097126 poses a problem regarding the reproducibility of media characteristics. For example, an optimal recording power differs between initially manufactured optical recording media and the 1000th one.

Moreover, since it is difficult to adopt direct-current sputtering for high-electrical resistance materials (e.g., oxides) for film deposition, radio-frequency sputtering is used.

Radio-frequency sputtering requires an expensive device for controlling high-frequency power, and radio-frequency sputtering devices are often big. On the other hand, direct-current sputtering can achieve film deposition with an inexpensive device. Moreover, radio-frequency sputtering offers low film deposition rates and low efficiency compared to direct-current sputtering. Accordingly, direct-current sputtering is desirable for the sputtering of Bi oxide-based materials, but at present, their inherent high-electrical resistance properties make the employment of direct-current sputtering difficult.

Conventionally, there have been made two attempts to replace radio-frequency sputtering by direct-current sputtering: (1) an attempt to make the target material electrically conductive to make direct-current sputtering applicable; and (2) an attempt to optimize the direct current waveforms. Furthermore, the combination of these attempts (1) and (2) has been employed.

There are several known strategies as to the method of reducing the electrical resistance of a target material by making it electrically conductive: (1) a strategy where a main material (Si) is doped with a substance (typified by Cr) with an electrical resistance lower than that of the main material (Si) (see JP-A No. 02-265052); (2) a strategy where a main material (Si) is heavily doped with a substance (PB) that reduces electrical resistance (see JP-A No. 05-36142); a strategy where a portion (oxygen ingredient) is removed from the main material (PLZT-PZT-based material) to reduce its electrical resistance (see JP-A No. 06-330297), etc.

With respect to the foregoing attempt (2), an attempt has been made to prevent such abnormal discharge as arching by means of a method of intermittently applying direct-current voltage rather than continuously (see JP-B No. 2578815) and/or a method of intermittently applying negative voltage (see JP-A No. 08-67980). This strategy is carried out by using the method of reducing the electrical resistance of target material together or by applying reverse-bias voltage (see JP-A No. 07-90573), because electric charges at the surface of the target material need to cancel when the target material is intended to remain insulating.

However, even when the a sputtering target has been made initially conductive by reducing its electrical resistance through the foregoing strategy (1), there would be a problem that because of the presence of reactive gases such as oxygen gas and nitrogen gas used upon film deposition, the conductivity of the target surface changes as the reaction proceeds, or a problem that when atmospheric air has been introduced in the vacuum chamber, the sputtering target reacts with oxygen in the air to cause conductivity change at the target surface.

To solve this problem JP-A No. 07-180045 discloses as a conductive target for direct-current magnetron sputtering, a sputtering target that contains at least 35% by volume of yttria based on the total amount of amorphous carbon and sputtering target. Amorphous carbon can be obtained by firing an organic complex to thermally decompose its ingredients other than carbon. After that, carbon films are formed in the pores created after the ingredients other than carbon were removed, thereby making the sputtering target conductive. In addition, the patent literature describes that the density of the sputtering target is about 45-70% of the theoretical value.

When carbon is used for this conductive sputtering target as a substance to make the target conductive, it seems that change in the conductivity of the target surface is small because there are no carbon oxides or carbon nitrides present as solid material. In the invention of this patent literature, however, there is a concern that abnormal discharge may occur due to pores created after removal of ingredients other than carbon. Moreover, since creation of such pores cannot be prevented, the density and strength of the sputtering target cannot be increased. Thus, for example, there is a concern that the sintered body may crack upon bonding to a backing plate due to reduced mechanical strength, and that high-rate film deposition cannot be realized because high-output sputtering causes cracks in the sputtering target.

The strategy (2) described above, where sputtering involves intermittent application of direct-current voltage and/or intermittent application of reverse-bias voltage at predetermined intervals, cannot avoid the use of a complicated device, which makes the device expensive. Thus there is no advantage in the adoption of direct-current sputtering.

JP-A No. 2000-264731 describes another attempt to achieve low electrical resistance by adding either diamond structure-free carbon or a conductive inorganic compound other than metal.

Although it is obvious that deposition of a film containing Bi, Fe and O can be done by direct-current sputtering using any of the conventional methods described above, it still remains unknown in this invention whether the resultant film can maintain characteristics as a recording layer.

In addition, JP-A No. 11-92922 discloses as a sputtering target for the deposition of dielectric films, a Bi oxide-based target, but this patent literature does not describe any Fe-containing target. If the constituent elements of a film to be deposited change, the composition of the sputtering target for that film needs to be changed correspondingly. This is because the composition or constituent compound of the sputtering target differs from that of the film to be deposited. The finding disclosed in the patent literature provides no basis for the present invention.

JP-B No. 02-42899 discloses a $Bi_3Fe_5O_{12}$ sputtering target for thin film deposition, but this sputtering target in this patent literature is one intended for ion beam sputtering for forming a thin film with a so-called garnet structure that imparts high magnetooptical effects, and no sputtering targets that make direct-current sputtering applicable are described.

To realize a recordable optical recording medium capable of high-density recording, it is necessary for that medium to include a film that contains Bi, Fe and O and has a stable structure and composition. To produce such a film a proper sputtering target needs to be prepared. The form and structure of the compound constituting the sputtering target, impurities contained therein, etc., affect the composition, crystallization properties, etc., of a film to be deposited. For this reason, it is required to select such a target-constituting compound that is suitable for the characteristics of a film required. Moreover, film deposition needs to be carried out by direct-current sputtering because recordable optical recording media need to be fabricated inexpensively.

However, it still remains unknown in this invention whether the strength of the target and the film deposition rate can be increased.

For increased film deposition rates, magnetron sputtering is often used together, in which a magnetic field generation means is placed under the sputtering target.

Magnetron sputtering increases the film deposition rate in the following way: Ar plasma is converged near the sputtering target by means of a magnetic field generated from the magnetic field generation means placed under the target, whereby the number of ions bombarding into the target surface increases, so too does the number of atoms to be sputtered. Both radio-frequency magnetron sputtering and direct-current magnetron sputtering can be used.

In magnetron sputtering, it is required that magnetic fluxes generated from the magnetic field generation means leak to the target surface side. Accordingly, if magnetic permeability of the sputtering target is high, it results in an increased number of magnetic lines passing through the target, and therefore, film deposition rates decrease due to insufficient magnetic field intensity of the leaked the magnetic flux. Thus, for a greater level of magnetic flux leakage, a sputtering target with a high magnetic permeability needs to be made thin and/or has a structure that facilitates magnetic flux leakage so that leaked magnetic fluxes are secured.

In addition, if sputtering targets are made thin, the sputtering time that can be spent for one piece decreases, resulting in a high frequency of replacement of sputtering target which entails opening and evacuation of the sputtering chamber. For this reason, manufacturing costs will increase due to poor productivity.

Furthermore, when sputtering targets are to be prepared by means of sintering method, the resulting sputtering targets need to be grinded for the removal of an oxidized region near the surface before they are put on the market. The degree of grinding is about 1 mm from the surface regardless of their thickness; therefore, the thinner the sputtering target, the more the proportion of the portion discarded without being sputtered, which also increases the manufacturing costs.

As another known technology, JP-B No. 3098204 and the like disclose a sputtering target where its magnetic permeability is successfully reduced by formulating a compound comprising Fe and other elements.

JP-A No. 06-184740 and the like disclose a sputtering target made of alloy particles made from a compound comprising an Fe group element and other elements, the reduced magnetic permeability of the sputtering being achieved by setting the average particle diameter of the alloy particles to within 200 μm or less.

Although it is obvious that application of these known technologies to a sputtering target containing Bi, Fe and O enables employment of magnetron sputtering, it still remains unknown whether an optical recording medium offering excellent characteristics can be fabricated using a film deposited in that way. Thus, these conventional technologies provide no basis for the present invention.

If the constituent elements of a film to be deposited change, the composition of the sputtering target for that film needs to be changed correspondingly. This is because the composition or constituent compound of the sputtering target differs from that of the film to be deposited. The findings disclosed in the patent literatures above provide no basis for the present invention.

JP-B No. 02-42899 sets forth description regarding a $Bi_3Fe_5O_{12}$ sputtering target for thin film deposition, where $Bi_2O_3$ and $\alpha$-$Fe_2O_3$ are mixed together and sintered for the preparation of the target. The invention disclosed in this patent literature, however, intends to produce a film with a so-called garnet structure that imparts high magnetooptical effects, failing to describe magnetron sputtering, and thus differs from the present invention.

To realize a recordable optical recording medium capable of high-density recording, it is necessary to produce a film that contains Bi, Fe and O (oxygen) and has a stable structure and composition. In view of productivity and manufacturing costs, film deposition rates and availability of sputtering target need to be taken into consideration. To achieve this, it is required to prepare a proper film by using a proper sputtering target. The form and structure of the compound constituting the sputtering target, impurities contained therein, etc., affect the composition, crystallization properties, etc., of a film to be deposited. For this reason, it is required to select such a target-constituting compound that is suitable for the characteristics of a film required. Moreover, film deposition needs to be carried out using high-film deposition rate methods because recordable optical recording media need to be manufactured inexpensively.

SUMMARY OF THE INVENTION

An object of the present invention is to solve the foregoing conventional problems and to achieve the object described below. That is, an object of the present invention is to provide a sputtering target suitable for mass production of optical recording media while achieving high reproducibility, a manufacturing method for the same, an optical recording medium manufactured by using the sputtering target, which the optical recording medium capable of high-density recording even in the blue laser's wavelength range, and a manufacturing method for the same.

The sputtering target of the present invention includes Bi and Fe, wherein the packing density of the sputtering target is greater than 96%, and wherein the sputtering target is used for the formation of a recording layer of a recordable optical recording medium.

The sputtering target of the present invention includes Bi and Fe, wherein the specific resistance of the sputtering target is 10 Ωcm or less, and wherein the sputtering target is used for the formation of a recording layer of a recordable optical recording medium.

The method of the present invention for manufacturing a sputtering target is one using a sintering method, wherein the sputtering target is used for the formation of a recording layer of a recordable optical recording medium and comprises Bi and Fe, and the packing density of the sputtering target is greater than 96%.

The recordable optical recording medium of the present invention is one including a recording layer containing Bi and Fe, wherein the recording layer is deposited using a sputtering target, wherein the sputtering target comprises Bi and Fe, and the packing density of the sputtering target is greater than 96%.

The recordable optical recording medium of the present invention is one including a recording layer containing Bi, Fe and O, wherein the recording layer is deposited using a sputtering target, wherein the sputtering target comprises Bi, Fe, and O, and the packing density of the sputtering target is greater than 96%.

The method of the present invention for manufacturing a recordable optical recording medium is one including: depositing a recording layer containing Bi and Fe by using a sputtering target, wherein the sputtering target comprises Bi and Fe, and the packing density of the sputtering target is greater than 96%.

The method of the present invention for manufacturing a recordable optical recording medium is one including: depositing a recording layer containing Bi, Fe and O by using a sputtering target, wherein the sputtering target comprises Bi, Fe and O, and the packing density of the sputtering target is greater than 96%.

DESCRIPTION OF THE PREFERRED EMBODIMENTS

Figure 1:
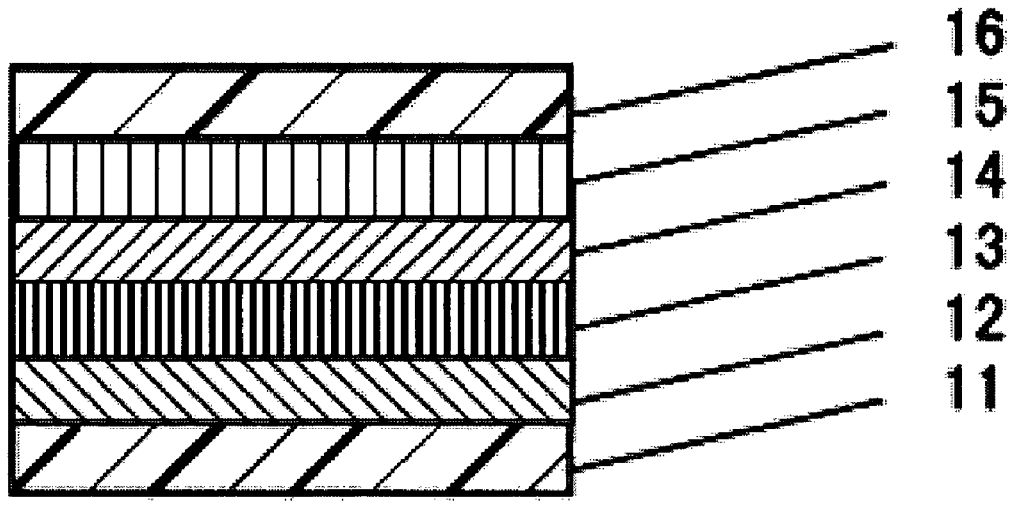
FIG. 1 shows a layer structure of an optical recording medium according to the present invention.

Hereinafter, the present invention will be described in detail.

In the prior application described above, packing density is limited to 65% to 96% because if it falls outside of this range, sputtering target is prone to fracture upon film deposition. Later studies, however, revealed that there is a problem with respect to the reproducibility of media characteristics during mass production even if packing density falls within this range.

Thus, the present inventors have diligently conducted experiments to overcome this problem. As a result, they have speculated that the difference in the degree of oxidization between the surface and internal areas in a BiFe sputtering target or the difference in the level of oxygen between the surface and internal areas of a BiFeO sputtering target reflects the variations in film quality among deposited films. The present inventors have focused on packing density as a parameter to be optimized to solve the foregoing problem. A sputtering target with a low packing density, or a loosely packed sputtering target, has a large proportion of pores, making its structure porous.

In addition, it seems that a non-uniform packing density distribution tends to result. Thus, the degree of oxidation may change readily even after elements constituting the sputtering target have been sintered. Since the degree of oxidation increases towards the target surface, it results in an increased likelihood of the generation of an increasing gradient of oxygen concentration from inside to outside. Moreover, a non-uniform pore density distribution in the sputtering target creates a difference in distance that oxygen atoms diffused inside the target. Thus it is likely that there would be a variation in the level of oxygen. To solve these problems, the present inventors have conduct studies to increase packing density as much as possible, and have established that a sputtering target suitable for mass production of optical recording media with high reproducibility can be obtained by increasing the packing density as high as greater than 96%. There is no upper limit with respect to packing density—it may be 100%, however, a preferable packing density range is 97.5% to 99.5%.

As used herein, the phrase "packing density" means the ratio of the weight of an actually manufactured sputtering target to the calculated weight of a sputtering target consisting of 100% substance of interest. The packing density can be calculated using the following equation:

Packing density=(weight of manufactured sputtering target/calculated weight)×100(%)

As described above, if a compound corresponding to the composition of a desired target is available, packing density can be determined based on the compound's density. However, if such a compound is not available, packing density is calculated using the densities of simple species such as $Bi_2O_3$ and $Fe_2O_3$. Suppose there is a composition consisting 1:1 combination of $Bi_2O_3$ and $Fe_2O_3$. In this composition, a stable compound $BiFeO_3$ is available, and on the assumption that such a compound is present in the composition, packing density is calculated by comparing the measurement value for the density of that compound with a value in a literature. In a composition where such a compound is not present, substances present in the composition are identified by X-ray diffraction and the relative proportions of these substances are determined. Subsequently, the packing density of the composition is calculated on the assumption that a compound consisting of these substances is present in the composition. For example, suppose there is a composition consisting of 2:1 combination of $Bi_2O_3$ and $Fe_2O_3$. In this composition, its packing density is calculated on the assumption that $Bi_2O_3$ and $BiFeO_3$ are present in a ratio of 1:2. Furthermore, in a complex composition where multiple crystal systems are present, packing density can be calculated on the assumption that $Bi_2O_3$ and $Fe_2O_3$ are present in the same ratio as Bi and Fe.

The sputtering targets according to first and second aspects of the present invention can be prepared by mixing and sintering metallic powders or oxide powders of raw material. The sputtering targets can be manufactured by weighing a set of a Bi powder and an Fe powder or a set of a Bi oxide powder and an Fe oxide powder, followed by mixing, dispersing, molding, sintering and processing of these powders. For a firing method, a firing method that involves pressurizing and heating can be used, such as hot press method or HIP method. The firing temperature is preferably high for the purpose of increasing packing density by facilitating bonding of powder particles. The firing temperature, however, needs to be so controlled that it never exceeds the melting point of the mixture. For example, when a Bi oxide and Fe oxide are sintered, sintering needs to be carried out at temperatures below around 800° C.—the melting point of the Bi oxide, which is the lowest of the two.

The problem of sputtering target fracture during a film deposition process as set forth in the foregoing prior application can be overcome by further reducing the particle diameter of raw material powder or by the addition of a glass-forming oxide, an intermediate oxide, a network-forming oxide, and/or a sintering aid. For example, it is effective to add an oxide of B, i, Ge or P, or an oxide of Sc, La, Y, Sn, Ba, Ca, Sr, Mg, Li, Na, K, Rb or Cs. It is also effect to add these elements as an element rather than as an oxide.

The manufacturing method for a sputtering target will be described roughly below. For example, when a Bi oxide and an Fe oxide are to be used, a powder of $Bi_2O_3$ (as a commonly occurring Bi oxide), and a powder of $Fe_2O_3$ (as a commonly occurring Fe oxide) are individually grinded by dry or wet pulverization, and sized to produce powder particles with similar particle diameters. Subsequently, the resultant powders are mixed together, molded by means of heat and pressure into a desired shape, and fired. The firing process is carried out by placing it in the air at 750° C. It is also possible to increase the strength of the resulting sputtering target by repeating the process in which the fired material is again pulverized and then molded while applying heat and pressure. The resultant fired material is then bonded to a backing plate made of oxygen-free copper by metal bonding or resin bonding, thereby providing a sputtering target.

Each of the sputtering targets according to the first and second aspects of the present invention, manufactured through the aforementioned process, inevitably consists mainly of Bi and Fe, or Bi, Fe and O. As used herein, the phrase "consist mainly of" and its derivative expressions mean, in general, that material is one consisting only of the element(s) described above, excluding impurities inherently contained in the raw material. Note, however, that trace amounts of additional element(s) may be added where necessary in order to, for example, improve media characteristics.

According to the first and second aspects of the present invention, it is possible to provide a sputtering target suitable for mass production of optical recording media while achieving excellent reproducibility.

The third aspect of the present invention relates to a sputtering target containing Bi and Fe and with a specific resistance of 10 Ωcm or less. Direct-current sputtering is made possible when the specific resistance is 10 Ωcm or less.

Moreover, 1 Ωcm or less is preferable because the sputtering target becomes less likely to change with time. Furthermore, 0.1 Ωcm or less is more preferable because abnormal discharge becomes less likely to occur and thus power supply voltage (direct current) can be increased, whereby the film deposition rate can be further increased. To achieve a specific resistance of as low as 10 Ωcm or less, for example, the sputtering target may be doped with a substance capable of imparting conductivity and/or oxygen atoms in the sputtering target may be removed to reduce its electrical resistance. The lower the specific resistance, the more suitable it is to perform direct-current sputtering; however, if the specific resistance is less than 10 μΩcm, the optical recording medium that includes films derived from that sputtering target undesirably offers poor characteristics. For this reason, the lower limit of the specific resistance is set to 10 μΩcm.

With respect to the proportion of Bi and Fe, since excellent recording characteristics can be obtained when Bi is present in a proportion of at least 28 atomic %, judging from the characteristics (or jitter value) of deposited recording layer as described later, the same recording characteristics level is expected to be maintained even when Bi and Fe are present in a proportion of nearly 100 atomic % In addition, in view of recording sensitivity, the proportion of Bi is preferably about 50 atomic %, with the total being nearly 100 atomic %. Oxygen atoms may be contained in an amount that can ensure a specific resistance range, inside of which direct-current sputtering is made possible. Additional element(s) may be added where necessary while considering the proportion of Bi. Considering the recording characteristics, film deposition efficiency, sputtering target's density, film deposition rate, etc., in a comprehensive manner, it is most preferable that the Bi-to-Fe ratio be around 2:1, and a greater effect can be obtained when it is in a range of 6:5 to 3:1. If the ratio of Bi to Fe is greater than this, recording marks become easy to be erased, undesirably.

According to the third aspect of the present invention, it is possible to provide a sputtering target which is suitable for the arbitrarily formation of a film having a stable composition and structure and to which direct-current sputtering can be applied.

The fourth aspect of the present invention relates to a sputtering target that contains Bi, Fe and O and further contains a substance imparting conductivity. A recordable optical recording medium provided with a film containing Bi, Fe and O as a recording layer offers excellent recording characteristics. However, sputtering targets for such a film are made of oxide and have met with a problem that direct-current sputtering is difficult to adopt for film deposition. To overcome this difficulty, a substance for imparting conductivity is added to the sputtering target to make direct-current sputtering film deposition applicable. Examples of such a substance for imparting conductivity include (1) either or both of Bi and Fe (both of which are in a metallic state), (2) carbon, (3) an oxide of at least one of Sn, In and Zn, (4) metal elements other than Bi and Fe, (5) rare-earth elements, and (6) Ge, Sb and Te among semiconductors and semi-metals. These substances (1) and (6) may be combined for use.

Since Bi and Fe are originally present as constituent elements, they rarely affect the characteristics of the resulting film. By using a mixture gas of Ar and oxygen as a sputtering gas during a film deposition process, the oxygen amount is controlled and thereby the control of the film characteristic is made possible.

In the case of (1), a preferable proportion of Bi and Fe is the same as in the third aspect of the present invention. In the case of (2), the specific resistance of the sputtering target is reduced when the content of carbon is 20% or more on a mole basis, and when it is 40% or less, recording characteristics of the resulting deposited film are not impaired; therefore, a preferable carbon content range is 20 mol % to 40 mol %. In this case, a preferable proportion of Bi and Fe is the same as in the third aspect of the present invention. In the case of (3), the ratio of Bi to Fe plus additional element (Bi:(Fe+additional element)) is preferably in a range of 6:5 to 3:1. The ratio of Fe to additional element is preferably around 1:6 because specific resistance needs to be reduced to a level that makes direct-current sputtering possible. In the case of (4), Bi:(Fe+additional element) is preferably 6:5 to 3:1 in view of, for example, recording characteristics. In addition, the ratio of additional element, when the Bi-to-Fe-to-additional element ratio is about 10:5:1, is preferably greater than this in order to make direct-current sputtering possible. Also in the case of (5) and (6), the ratio of additional element is preferably the same as in (4).

The sputtering target according to the fourth aspect of the present invention is prepared by mixing and firing oxide powders of raw materials. The sputtering target can be manufactured by weighing a Bi powder, an Fe powder and a powder of a substance for imparting conductivity, followed by mixing, dispersing, molding, sintering and processing of these powders. Alternatively, the sputtering target can be obtained by preparing a powder of a compound consisting mainly of Bi, Fe and O and a powder of a substance for imparting conductivity and firing the powders.

For a firing method, a firing method that involves pressurizing and heating can be used, such as hot press method or HIP method. The firing temperature is preferably high for the purpose of increasing packing density by facilitating bonding of powder particles. The firing temperature, however, needs to be so controlled that it never exceeds the melting point of the mixture.

For example, when a Bi oxide, an Fe oxide and carbon are mixed and sintered, sintering needs to be carried out at temperatures below around 800° C.—the melting point of the Bi oxide, which is the lowest of the three.

The fifth aspect of the present invention relates to a sputtering target that contains Bi and Fe, or Bi, Fe and O, and contains a compound where oxygen is reduced compared to the stoichiometric composition. By reducing the amount of oxygen atoms, metallic properties emerge due to Bi and Fe atoms increased relative to oxygen atoms, thereby reducing electric resistance and making direct-current sputtering film deposition applicable. To be more specific, Bi, Fe, a Bi oxide, and an Fe oxide are mixed together and sintered to prepare a sputtering target. Since metallic powders are contained in the raw material powder, metals are susceptible to oxidation upon sintering in the target being formed. At this point, oxides around the metals are susceptible to reduction, though, oxygen atoms coming from the outside do not reach the inside of the target, causing oxygen paucity uniformly inside the target. In this way a certain amount of oxygen atoms are uniformly removed from the target except at its outermost surface. By scraping away the target surface upon processing, it is possible to provide a sputtering target which contains Bi, Fe and O, which contains a compound where oxygen is reduced compared to the stoichiometric composition, and which is stable over time. By firing the target under oxygen-free atmosphere (e.g., under vacuum or inert gas), a sputtering target can be obtained in which oxygen paucity occurred even in the near-surface area.

An excellent recordable optical recording medium can be obtained by forming a recording layer by direct-current sputtering of this sputtering target. By using a mixture gas of Ar and oxygen as a sputtering gas upon film deposition using direct-current sputtering, a recording layer of high stability can be obtained.

The sixth aspect of the present invention relates to a sputtering target in which the proportion of an element other than O, i.e., Bi is 28 atomic % or more. An optical recording medium, in which its recording layer is formed of a BiFeO film deposited using this sputtering target, offers excellent characteristics. The element Bi inherently offers high sputtering yield and is thus capable of high-rate film deposition, but its melting point is so low that, when contained before sintering, sintering needs to be carried out at a temperature as low as around 270° C. For this reason, it is difficult to increase the packing density and, accordingly, the strength of the resulting sputtering target. If the proportion of Bi is 44 atomic % or more, it is possible to ensure that packing density is 80% or more and to manufacture a sputtering target with enough strength, which allows manufacture of a Bi-rich recording layer that offers excellent recording characteristics.

Deposition of recording layer is carried out in a mixture gas of Ar and oxygen. It is therefore possible to manufacture an excellent recording layer containing Bi, Fe and O.

As used herein, the phrase "packing density" means the ratio of the weight of an actually manufactured sputtering target to the calculated weight of a sputtering target consisting of 100% substance of interest. The packing density can be calculated using the following equation:

Packing density=(weight of manufactured sputtering target/calculated weight)×100(%)

The seventh aspect of the present invention relates to a sputtering target containing at least one of Bi and Fe, both of which are in a metallic state. When a recording layer containing Bi, Fe and O is to be prepared by direct-current sputtering, at least one of Bi and Fe, both of which are present in a metallic state, is contained in the sputtering target, whereby the electrical resistance of the target decreases and thus direct-current sputtering is made possible. Although Bi is not a metal that features low electrical resistance, its electrical resistance is low enough to allow direct-sputtering. Since Bi and Fe are originally present in the recording layer as an oxide, their influence on the recording characteristics can be minimized.

The optical recording medium in which a BiFeO film, prepared by film deposition using any of these sputtering targets while introducing oxygen gas, is used as a recording layer offers excellent characteristics.

The eighth aspect of the present invention relates to a sputtering target containing carbon. Carbon not only has conductivity, but also is chemically stable and is hard to exert influence. In addition, the sputtering target has a low sputtering yield and is less likely to be incorporated into a film being made. The phrase "sputtering yield" means easiness to be sputtered under the same sputtering condition. The fact that sputtering yield is low means that atoms are hard to move out of the target and the released atoms are hard to incorporate in the film being made. Among several kinds of carbon, graphite and amorphous carbon are preferable in terms of their low electrical resistance. Moreover, by using a mixture gas of Ar and oxygen as a sputtering gas, the recording film being made can receive oxygen in an amount sufficient to offer excellent recording characteristics, and carbon atoms are less likely to remain in the film because carbon is oxidized to form $CO_2$ gas which is discharged to the outside.

The ninth aspect of the present invention relates to a sputtering target containing an oxide of at least one of In, Zn and Sn. It is also highly effective to add an oxide with a relatively low electrical resistance, such as tin oxide, indium oxide, or zinc oxide. If a sputtering target can be prepared using only oxides, it eliminates the need to add oxygen as a gas. Although this results in the incorporation of tin, indium or zinc in the recording film being made, any of these elements do not adversely affect the characteristics of the resulting recording layer, but rather increase its stability. Also in this case, there is an effect that film deposition that involves the addition of oxygen gas can further enhance recording characteristics.

The tenth aspect of the present invention relates to a sputtering target containing at least one element other than Bi and Fe. It is thus made possible to impart conductivity to the target. Metal has such a low electrical resistance enough to make direct-current sputtering applicable and, when added in an appropriate amount, has an effect, for example, to enhance target's strength, recording characteristics, and storage stability.

Metals that are particularly of high effect can be of distinct four groups according their effects: In, Zn, and Sn (first group); Pd, Cu, Ni, Zn, Co, and Li (second group); V, Mo, W, Sn, Ti, Al, Cr, Na, Mg, and Ca (third group); and Sb and Te (fourth group). Any of the metals belonging to the first group can impart conductivity when added as a metal; even when oxidized, the resulting oxide has such a low electrical resistance that it is possible to adopt direct-current sputtering. In addition, an effect that recording characteristics and storage stability improve will be provided by the addition of these elements. A sputtering target added with at least one of the metal of the second group particularly shows increased strength, and becomes hard to crack even when greater direct current is applied during film deposition, thereby achieving increased film deposition rates. The optical recording medium manufactured using that sputtering target offers excellent recording characteristics. A sputtering target containing at least one of the elements of the third group is highly effective in enhancing the characteristics of the optical recording medium in which a recording layer formed using that sputtering is provided. When at least one of the elements of the fourth group is added to a sputtering target, the film deposited using that target becomes stable; in particular, stability of its amorphous state increases, and therefore, storage stability can be expected to increase. Furthermore, even when these elements are incorporated in the recording layer being made, it never adversely affects recording characteristics but rather enhances recording characteristics and storage stability. By carrying out film deposition in a mixture gas of Ar and oxygen, the deposited film is in the form of oxide and thus offers excellent characteristics.

The eleventh aspect of the present invention relates to a sputtering target containing at least one of B, Si, Ge, a rare-earth element, and an oxide thereof. When a sputtering target contains such an element or oxide thereof, the resulting optical recording medium offers excellent characteristics. These elements can be divided into three groups according to their effects brought about at the time when contained as an element rather than as an oxide: Ge and rare-earth metals (first group); B and Si (second group); and B, Ge, Y, Ce, Nd, Sm, Gd, Tb and Dy (third group). With respect to the first group, Ge and rare-earth metals all have low electrical resistance to an extent that makes direct-current sputtering applicable when present as a single element rather than as a compound such as an oxide. The addition of these elements imparts conductivity and thus makes direct-current sputtering applicable. On the other hand, the elements of the second group—B and Si—are not conductive per se. However, a recording layer containing Bi, Fe, B and O and a recording layer containing Bi, Fe, Si and O both offer excellent characteristics. The elements of the third group have an effect of increasing target's strength, but when added in the form of oxide, it becomes imperative to impart conductivity by allowing Bi and/or Fe, both of which serve to remove oxygen atoms, to be present as metal. When B and Ge have been added as an oxide, not only recording characteristics and storage stability enhances, but also target's strength increases, thus resulting in increased film deposition rates. This is highly effective. In any of these cases it is required to carry out film deposition while moderately introducing oxygen gas.

The added amount of B, Si and Ge is preferably about 0.1% by mass to 5% by mass. In the case of B, for example, greater effects can be brought about when the ratio Bi:Fe:B ranges from about 10:4:1 to 10:1:4. The same relationship applied to Si and Ge.

The twelfth aspect of the present invention relates to a sputtering target, wherein packing density is greater than 96%.

A sputtering target having a low packing density offers low strength, and film deposition rates cannot be increased. When packing density is greater than 96%, target's strength remarkably increases and thus the strength of the resulting film increases, too. Even when packing density is around 70-80%, the optical recording medium manufactured using that sputtering target offers excellent recording characteristics in some cases. However, in this low packing density range, the sputtering target is fragile and its strength is still low. Thus, supply voltage during the film deposition process cannot be increased and accordingly, film deposition rates cannot be increased. If packing density is 80% or more, target's strength somewhat increases, but when it exceeds 96%, target's strength further increases. In addition, the film deposition rate sometimes doubles, which is highly effective.

The thirteenth aspect of the present invention relates to a sputtering target is directed to the formation of a recording layer of an optical recording medium, wherein the sputtering target contains Bi and Fe and has at least one of a shape, a structure and a composition for allowing a magnetic flux to leak from the target surface side, and wherein magnetron sputtering can be applied.

The recordable optical recording medium in which a film containing Bi, Fe and O is used as a recording layer offers excellent recording characteristics. The sputtering method is most suitable for the formation of this recording layer.

As the sputtering method used to increase the film deposition rate, magnetron sputtering is often used in which magnetic field generation means is placed under the sputtering target in order to increase the magnetic flux density near the surface of the target by allowing magnetic fluxes to leak from the target surface side for increased the density of ions near the target surface, which the ions are bombarded into the target to kick out atoms.

However, when the sputtering target contains a ferromagnetic element (e.g., Fe) or a ferromagnetic compound, magnetic permeability of the target increases and thus magnetic fluxes come to pass through the inside of the target, causing magnetic fluxes to be less likely to leak from the target surface to result in a reduced film deposition rate.

To avoid this problem, the thirteenth aspect of the present invention is directed to a sputtering target having at least one of a shape, a structure and a composition, all of which are designed to increase magnetic fluxes leaking from the target surface side, whereby magnetron sputtering is made applicable even to a sputtering target containing Bi and Fe. With this sputtering target, it is made possible to achieve, at the same time, the deposition of a recording layer which contains Bi, Fe and O and which offers excellent characteristics and improvement of film deposition efficiency.

To allow as many magnetic fluxes to leak from the target surface side as possible, it is preferable that Fe is not present in the sputtering target as a element. Including the method for realizing such a compound, the methods for allowing magnetic fluxes to leak from the target surface include methods (1) to (5) described below, which may be used in combination.

Method (1): to prepare a sputtering target consisting only of a non-ferromagnetic substance or consisting mainly of a non-ferromagnetic substance, so that magnetic permeability is reduced as a whole.

Method (2): to prepare a sputtering target having a shape or a structure that facilitates leakage of magnetic flux.

Method (3): to prepare a sputtering target with a structure that resembles aggregated particles, in which a magnetic bond between the particles is broken and thereby magnetic permeability is reduced as a whole.

Method (4): for example, even a ferromagnetic element with a high saturation magnetic flux density and high magnetic permeability, such as Fe, can be a species with a low saturation magnetic flux density and low magnetic permeability when formulated as a compound; thus, a sputtering target formed of an aggregation of such a compound is prepared.

Method (5): to prepare a thin sputtering target.

A ferromagnetic substance refers to a substance that becomes magnetized in a certain direction due to a magnetic field and leaves magnetic hysteresis even after the removal of the magnetic field by leaving remanent magnetization. In the present invention, substances other than those that offer this ferromagnetism are collectively referred to as a non-ferromagnetic substance.

As an example of the method (1), the following compounds are prepared: one consisting of a mixture of $Bi_2O_3$ and $\alpha$-$Fe_2O_3$; one consisting of Bi and $\alpha$-$Fe_2O_3$; and one consisting of $BiFeO_3$, $Bi_2O_3$ and $Fe_2O_3$. All of these compounds are a non-ferromagnetic substance, but Fe and/or $\gamma$-$Fe_2O_3$, a ferromagnetic substance, may be added in trace amounts.

As an example of the method (2), grooves or the like are formed in the surface of the sputtering target to produce portions with a small cross-sectional area compared to the other portions. In those portions magnetic fluxes are concentrated readily, and magnetic fluxes tend to leak through these portions.

As an example of the method (3), a paramagnetic sputtering target is prepared as described below. Even a ferromagnetic substance becomes superparamagnetic—a state that exhibits paramagnetism—when its particle size ranges from several nanometers to several tens of nanometers. The particle size that renders particles superparamagnetic differs depending on the type of the substance, however, it is often in the range of several tens of nanometers. Thus, it is possible to prepare a paramagnetic sputtering target by forming an aggregation of such particles while preventing them to be bonded together magnetically. In this way magnetic flux leakage can be facilitated. For example, a structure is designed in which such particles are surrounded by another non-magnetic substance. More specifically, a sputtering target with a low magnetic flux density and low magnetic permeability can be prepared by designing a structure in which superparamagnetic fine particles of Fe or an Fe compound are surrounded by a material made of, Bi, a Bi compound, or a non-ferromagnetic substance. As a consequence, magnetic fluxes leak from the target surface side more easily and thus application of magnetron sputtering is made possible. In addition, the presence of fine crystals that shows superparamagnetic properties influences nearby particles to reduce magnetic permeability. If the volume (%) of particles having a diameter as low as 10 nm or less enough to show superparamagnetic properties equals to the half-average particle diameter raised to the third power, magnetic permeability is expected to be reduced to a level that enables magnetron sputtering applicable. Moreover, if there is a large variance in crystal particle diameters, composition alternation becomes more likely to occur.

The magnetic permeability $\mu$ is preferably about 10 or less. It is also effective to adopt a compound that offers a compensation temperature at which the magnetization apparently becomes zero equals to room temperature or below.

As an example of the method (4), a sputtering target is prepared which is formed of a mixture compound consisting of a compound of Fe and another element, and Bi or a Bi compound; examples of such a mixture compound include a compound consisting of an Fe—Si alloy and Bi, a compound consisting of Bi—Li and Fe—Ge, and a compound consisting of $Mg_3Bi_2$ and $Fe_3Sn_2$. In this way it is made possible to reduce the saturation magnetic density and magnetic permeability. By using such a sputtering target formed of such a mixture compound, many magnetic fluxes are allowed to leak from the target surface side, so that magnetron sputtering is made applicable.

As an example of the method (5), a method of reducing the thickness of a sputtering target can be exemplified. Even when Fe is present as an element rather than as a compound, the magnetic flux leak level increases to a level that enables magnetron sputtering applicable by reducing the thickness of the sputtering target to around 1 mm. An optimal thickness differs depending on the kind of the compound constituting the target and/or target's composition. Anyway, the effect of the present invention can be provided by means of the method of reducing the thickness of the sputtering target to an extent that enables magnetic sputtering applicable.

In addition, although not adopted in the aforementioned methods (1) to (5) in some cases, it is also possible to reduce the saturation magnetic flux density and magnetic permeability by setting the compensation temperature to around room temperature or by using a material having a Curie temperature around a temperature raised as a result of plasma discharge during a film deposition process.

By using the methods described above alone or in combination, the magnetic flux leakage level at the target surface side can be increased, whereby magnetron sputtering is made applicable.

The sputtering target according to the thirteenth aspect of the present invention can be prepared by mixing and firing oxide powders of raw materials; a mixture of a Bi oxide powder and an Fe oxide powder can be fired to prepare the sputtering target. Alternatively, it is possible to prepare the sputtering target by making a powder of a compound that mainly contains Bi, Fe and O and by firing that powder.

For a firing method, a firing method that involves pressurizing and heating can be used, such as hot press method or HIP method. The firing temperature is preferably high for the purpose of increasing target's strength. In the case a compound consisting of Bi, Fe and O phase separation and melting occur when the firing temperature is about 800° C. or more, which makes uniform firing difficult to achieve. To avoid this problem, it is necessary to control the firing temperature within about 750° C. For example, when a Bi oxide and an Fe oxide are mixed together for sintering, sintering needs to be carried out at temperatures below around 800° C.—the melting point of the Bi oxide, which is the lowest of the two. In addition, a Bi powder and an $\alpha$-$Fe_2O_3$ powder may be mixed together for sintering. Since the sputtering target prepared using these powders has higher thermal conductivity than those consisting only of oxides, it acquires resistance to fracture during a film deposition process.

According to the thirteenth aspect of the present invention, it is possible to provide a sputtering target which is suitable for the arbitrarily formation of a film having a stable composition and structure and to which magnetron sputtering can be applied.

The fourteenth aspect of the present invention relates to a sputtering target containing a non-ferromagnetic compound.

To allow as many magnetic fluxes to leak from the target surface side as possible, it is preferable that the sputtering target consist only of a non-ferromagnetic compound, but even when a ferromagnetic compound is contained, magnetic flux leakage increases when the content of the non-ferromagnetic compound is greater than about 50 vol %. Furthermore, if the ferromagnetic compound is one having a magnetic flux density as great as that of $\gamma$-$Fe_2O_3$, magnetic flux leakage occurs to an extent that enables magnetron sputtering possible even when the content of the non-ferromagnetic compound is about 30 vol %.

The fifteenth aspect of the present invention relates to a sputtering target containing Fe as a ternary compound BiFeO.

To make magnetron sputtering applicable, it is required to prepare a sputtering target with a less amount of ferromagnetic ingredient, but when Fe is contained as a non-ferromagnetic compound, the sputtering target is no longer ferromagnetic and thus magnetron sputtering can be used. For example, $BiFeO_3$ with a perovskite structure is antiferromagnetic and thus offers low magnetic permeability, thus making magnetron sputtering applicable. In addition, compounds with a small Fe content, such as $Bi_{25}FeO_{40}$ and $Bi_{36}Fe_2O_{57}$—although whether or not they are ferromagnetic still remains elusive—offer low saturation magnetic flux density and low permeability even they are shown to be ferromagnetic. The inclusion of such a ternary compound, BiFeO, is highly effective. The preparation of a sputtering target containing such a compound involves firing of a mixture of a Bi oxide and an Fe oxide to prepare a powder of a ternary compound BiFeO, followed by a sintering process at a temperature that the compound never melts, forming the sintered body into a sputtering target shape. In this sintering process, pressureless sintering method, hot press method, HIP method or the like can be used.

The sixteenth aspect of the present invention relates to a sputtering target containing Fe as $\alpha$-$Fe_2O_3$. Even when an Fe oxide is contained, magnetron sputtering can be used if the Fe oxide is not a ferromagnetic substance. $\gamma$-$Fe_2O_3$ and $Fe_3O_4$ (magnetite) are both ferromagnetic substances and thus are not preferable. On the other hand, $\alpha$-$Fe_2O_3$ (hematite) is a paramagnetic substance. Accordingly, when an Fe oxide is intended to be added to a sputtering target consisting mainly of a ternary compound BiFeO in order to adjust the relative proportions of the elements, it is highly effective to add $\alpha$-$Fe_2O_3$ (hematite), a paramagnetic substance, to the sputtering target.

The seventeenth aspect of the present invention relates to a sputtering target that has a shape allowing a magnetic flux to leak from its surface. Although a method of optimizing magnetic characteristics (e.g., magnetic permeability) so as to allow magnetic flux to leak from the target surface is available, a method of changing the target' shape is also effective to achieve magnetic flux leakage. By providing grooves or the like in the surface of a flat-shaped target, it becomes easy for magnetic fluxes to leak to the outside through the grooves. The cross-sectional area of the portions provided with the grooves is small and thus magnetic density in those portions easily increases and, once it has exceeded the saturation magnetic flux density, it results in magnetic flux leakage. At portions where the shape changes drastically e.g., corners of the grooves, magnetic poles are generated to change the magnetic flux flow, facilitating magnetic flux leakage. These effects make magnetron sputtering applicable. In particular, when grooves are placed at positions over the magnetic poles generating magnetic fields upon magnetron sputtering, the area of the sputtering target to be sputtered increases and thus the film deposition rate and target availability increase. Moreover, in the case of a round-shaped sputtering target, greater effects can be obtained when concentric grooves are provided around the center of the sputtering target.

The eighteenth aspect of the present invention relates to a method for manufacturing the sputtering target according to first or third aspect of the present invention, wherein the method involves a sintering method. Examples of the manufacturing method for a sputtering target include a sintering method in which raw material powders are solidified by heating them while preventing melting, and a dissolution method in which raw material powders are dissolved, mixed, and cooled to prepare a sputtering target. Since oxides have higher melting temperatures, the sintering method is used to manufacture an excellent-quality sputtering target at low costs. In the case where metals are used, when a sputtering target is to be manufactured using substances with significantly different melting points (e.g., Bi and Fe), the sintering method is used to prevent the occurrence of composition alternation and segregation, whereby manufacture of an excellent-quality sputtering target is made possible. In the dissolution method, crystal growth is likely to occur and in a film deposited using a sputtering target having large crystals, composition alternation occurs and it results in poor reproducibility of films, which is undesirable. The sintering method, by contrast, is highly effective, that is, a sputtering target with a small crystal particle diameter can be obtained by reducing the particle diameters of powders to be mixed.

Broadly, the manufacture process follows the following steps: weighing of raw materials, mixing of the raw materials using a dry ball mill, hot press, molding, and bonding. The manufacture process may follow weighing, wet ball milling, spray drying, hot press, molding, and bonding.

The manufacture process for a sputtering target will be described broadly. For example, if a Bi oxide, an Fe oxide and carbon that serves to impart conductivity are to be used, $Bi_2O_3$ (a commonly occurring Bi oxide), $Fe_2O_3$ (a commonly occurring Fe oxide), and graphite powder (commonly occurring carbon) may be used.

These compounds are individually grinded by dry or wet pulverization and sized to produce powder particles with similar particle diameters. Subsequently, the resultant powders are mixed together, molded by means of heat and pressure into a desired shape, and fired. The firing process is carried out by placing it in the air at 750° C. It is also possible to increase the strength of the resulting sputtering target by repeating the process in which the fired material is again pulverized and then molded while applying heat and pressure. The resultant fired material is then bonded to a backing plate made of oxygen-free copper by metal bonding or resin bonding, thereby providing a sputtering target.

Using the sintering method it is possible to manufacture a sputtering target in which substances with significantly different melting points (e.g., Bi and Fe) are mixed. In addition, since sintering is carried out for powders, the magnetic characteristics of powder particles can be retained without deterioration, and therefore, it is made possible to manufacture a sputtering target while controlling its magnetic characteristics such as magnetic flux density and magnetic permeability. The use of the sintering method allows manufacturing of a sputtering target in which saturation magnetic flux density and magnetic permeability are set as desired and to which magnetron sputtering can be applied.

The nineteenth and twentieth aspects of the present invention each relates to a recordable optical recording medium having a recording layer consisting mainly of Bi and Fe, or Bi, Fe and O, wherein the recording layer according to the nineteenth aspect of the present invention is one deposited using the sputtering target according to the first or third aspect of the present invention, and wherein the recording layer according to the twentieth aspect of the present invention is one deposited using the sputtering target according to the second or fourth aspect of the present invention.

Upon fabrication of a recordable optical recording medium, necessary films are deposited on a resin substrate made of, for example, polycarbonate. The resin substrate may be provided with a groove and/or pits for tracking control. A recording film consisting mainly of Bi and Fe, or Bi, Fe and O is formed by sputtering of a target under vacuum while introducing argon gas or a mixture of argon gas and oxygen gas. Where necessary, a protective layer or the like may be provided for protecting a reflective layer and/or for improved characteristics.

By introducing argon gas and applying high-frequency voltage under vacuum, a film containing Bi, Fe and O is deposited. By introducing oxygen gas in addition to argon gas, it is possible to control the oxygen amount in the recording film being made and thus to readily provide excellent characteristics. Additionally, a metal film that serves as a reflective layer, a protective layer for improved characteristics, etc., may be provided.

According to the nineteenth and twentieth aspects of the present invention, it is possible to provide a recordable optical recording medium manufactured using a sputtering target that is suitable for mass production of optical recording media and the like with excellent reproducibility The twenty-first aspect of the present invention relates to a manufacturing method for an optical recording medium that includes a recording layer containing Bi and Fe, wherein the recording layer is deposited using the sputtering target according the first or third aspect of the present invention.

The twenty-second aspect of the present invention relates to a manufacturing method for an optical recording medium that includes a recording layer containing Bi, Fe and O, wherein the recording layer is deposited using the sputtering target according the second or fourth aspect of the present invention. With this manufacturing method it is possible to increase the film deposition rate and productivity. In addition, by additionally introducing oxygen gas, recording characteristics can be further enhanced.

The twenty-third aspect of the present invention relates to a manufacturing method for an optical recording medium, wherein a recording layer is formed by direct-current sputtering of the sputtering target according to the first or third aspect of the present invention. With this manufacturing method, short-time film deposition is made possible and thus manufacturing costs can be reduced.

Next, the configuration of the recordable optical recording medium of the present invention will be described with reference to the drawings. FIG. 1 shows a configuration example of the recordable optical recording medium of the present invention, wherein an under layer 12, a recording layer 13, an upper layer 14, a reflective layer 15, and a protective layer 16 are provided over a substrate 11.

Examples of the materials of the under and upper layers 12 and 14 include metal oxides such as $SiO_x$, ZnO, $SnO_2$, $Al_2O_3$, $TiO_2$, $In_2O_3$, MgO, $ZrO_2$ and $Ta_2O_5$; nitrides such as $Si_3N_4$, AlN, TiN, BN and ZrN; sulfides such as AgS, AlS, BS, BaS, BiS, CaS, CdS, CoS, CrS, CuS, FeS, GeS, InS, KS, LiS, MgS, MnS, MoS, NaS, NbS, NiS, PbS, SbS, SnS, SrS, WS, ZnS and $TaS_4$; and carbides such as SiC, TaC, $B_4C$, WC, TiC and ZrC. These compounds may be used singly or combination (i.e., as a mixture) for the under layer 12 or upper layer 14; examples of such a mixture include a mixture of ZnS and $SiO_x$, and a mixture of $Ta_2O_5$ and $SiO_x$. Physical properties that need to be taken into consideration when using these compounds or mixtures thereof for the under and upper layers 12 and 14 include thermal conductivity, specific heat, refraction index, and adhesiveness to the materials of the substrate or recording layer. In addition, high melting points and good adhesiveness are required.

According to the finding of the present inventors, it is preferable that a sulfide be contained in at least one of the under and upper layers 12 and 14 in view of recording characteristics.

The under layer 12 serves to improve recording sensitivity, reflectivity and other recording/reproducing characteristics, as well as the recording layer reliability. To be more specific, polycarbonate is generally used for the substrate of optical recording media in view of costs, but polycarbonate offers low gas barrier properties against moisture and oxygen. For this reason, when a recording layer is provided on the polycarbonate substrate, the recording layer tends to degrade. To avoid this, it is preferable to provide an under layer to suppress the degradation of the recording layer. Note, however, that there is no need to provide such an under layer in a case where material that offers high gas barrier properties is used for the substrate or where a gas barrier layer is provided over the laser incident surface of the substrate. According to the finding of the present inventors, $Al_2O_3$, ZnS—$SiO_2$, AlN, ZrN, SiN and the like are most preferable for the under layer.

While the upper layer 14 stores heat generated as a result of application of laser light to the recording layer during a recording process, it serves to transfer the heat to the reflective layer for heat dissipation. According to the finding of the present inventors, it is preferable to use a mixture of ZnS and $SiO_2$.

The thickness of the under layer 12 is set to 10 nm to 150 nm, preferably 15 nm to 100 nm and, more preferably, 15 nm to 50 nm. If the thickness is less than 10 nm, it results in failure to ensure sufficient recording layer reliability, though depending largely on the material and quality of the under layer. If the thickness is greater than 150 nm, during a film deposition process by sputtering or the like, the temperature of the film being made increases and thus causes film separation and/or cracks, resulting in poor productivity undesirably.

The thickness of the upper layer 14 is set to 5 nm to 200 nm, preferably 8 nm to 150 nm and, more preferably, 10 nm to 30 nm. If the thickness is less than 5 nm, it results in reduced recording sensitivity. If the thickness is greater than 200 nm, film separation and/or deformation occur due to raised temperature during film deposition.

The thickness of the recording layer 13 is preferably set to 3 nm to 30 nm, more preferably 5 nm to 20 nm and, further preferably 5 nm to 15 nm. If the thickness is less than 3 nm, it results in significant reduction in the recording sensitivity and it becomes difficult to obtain sufficient modulated amplitudes. If the thickness is greater than 30 nm, there is a tendency that recording characteristics deteriorate.

The materials of the substrate are not specifically limited as long as they have excellent thermal and mechanical characteristics and, when recording and reproduction of information is performed from the substrate side (through the substrate), excellent optical transparency; examples include polycarbonate, methyl polymethacrylate, amorphous polyolefin, cellulose acetate and polyethylene terephthalate. However, polycarbonate and amorphous polyolefin are preferable. The thickness of the substrate is not particularly limited and can be determined depending on the intended purpose.

When the reflective layer 15 is to be provided, the materials of the reflective layer 15 are preferably those with high reflectivity sufficient to reflect light of wavelength equal to that of reproduction light. For example, metals such as Au, Al, Ag, Cu, Ti, Cr, Ni, Pt, Ta and Pd can be used singly or in combination (as an alloy). Moreover, while containing any of the foregoing elements or an alloy thereof as a main ingredient, the reflective layer 15 may contain an additional element; examples include metals and semi-metals such as Mg, Se, Hf, V, Nb, Ru, W, Mn, Re, Fe, Co, Rh, Ir, Zn, Cd, Ga, In, Si, Ge, Te, Pb, Po, Sn and Bi. A reflective layer consisting mainly of Ag and Al is particularly preferable in view of its low cost and easiness to obtain high reflectivity. Alternatively, it is possible to form a multilayered film by alternately stacking a low-refractive index thin film and a high-refractive thin film, both of which is made of material other than metal, and to use the multilayered film as a reflective layer.

As a method for forming a reflective layer, for example, sputtering method, ion-plating method, chemical vapor deposition, and vacuum vapor deposition can be exemplified.

A preferable thickness of the reflective layer is 40 nm to 300 nm in the case of single-layer structure.

In the case of multi-layered structure, thin films other than the one farthest from the laser incident side all need admit laser light; therefore, a reflective layer with a multi-layered structure is generally referred to as a semitransparent layer rather than a reflective layer. In this case, a preferable thickness of the semitransparent layer is 3 nm to 40 nm. In addition, a known organic or inorganic intermediate layer and/or adhesive layer may be provided over the substrate or below the reflective layer for the purpose of, for example, improving reflectivity, recording characteristics, and adhesiveness.

The protective layer 16 may be provided on the reflective layer and/or between other layers where necessary.

Any known materials can be used as the materials of the protective layer 16 as long as they can protect other layers against external pressures. Examples of organic materials used for the protective layer 16 include thermoplastic resins, thermosetting resins, electron beam-curable resins and ultraviolet ray-curable resins. Examples of inorganic materials used for the protective layer 16 include $SiO_2$, $SiN_4$, $MgF_2$ and $SnO_2$. Examples of ultraviolet ray-curable resins include acrylate resins such as urethane acrylate, epoxy acrylate and polyester acrylate. These materials may be used singly or in combination, and may be used to form a single-layered film or a multi-layered film.

As a method for forming a protective layer, coating methods such as spin coating and casting coating, sputtering, and chemical vapor deposition can be used, however, spin coating is most preferable. A film made of thermoplastic resin or thermosetting resin can be prepared by dissolving resin raw material in a suitable solvent, applying the resulting solution, and drying the solution. A film made of ultraviolet-curable resin can be prepared by applying resin raw material as it is or after dissolving it in a suitable solvent, and exposing it to ultraviolet light for curing.

The thickness of the protective layer is generally set to 0.1 μm to 100 μm, however, 3 μm to 30 μm is particularly preferable.

The recordable optical recording medium of the present invention may be one in which an additional substrate is bonded on a given constituent layer, or may have a multilayered structure in which constituent layers face each other as inner layers.

Alternatively, the recordable optical recording medium of the present invention may be a multilayered recordable optical recording medium in which a groove is formed on a given constituent layer using ultraviolet ray-curable resin or the like and another given constituent layer is formed thereon. The recordable optical recording medium of the present invention is not limited to a configuration in which light is applied only from the substrate side for recording and reproduction of information, but may be a configuration where a cover layer is provided on a given constituent layer, through which laser light passes for recording and reproduction of information. By recording and reproducing information from the cover layer side, much higher recording density can be realized. This cover layer is generally made of polycarbonate or ultraviolet ray-curable resin. The phase 'cover layer' used in the present invention may include an adhesive layer for the cover layer.

The shorter the wavelength of laser light used for the recordable optical recording medium of the present invention, the more preferable for high-density recording. In particular, laser lights of 350 nm to 530 nm wavelengths are preferable. A typical example of such a laser light is one whose center wavelength is 405 nm.

The optical recording medium of the present invention include optical recording media that can be written only once and optical recording media that can be written several times and where the written information cannot be rewritten, or so called write-once optical recording media. The sputtering target of the present invention can be even used for the manufacture of optical recording media other than recordable ones (e.g., magnetic optical discs). Although optical recording media have been focused in the above description, the application of the sputtering target of the present invention is not limited to such optical recording media, but it can be used in other applications if the film performance matches. For example, the sputtering target of the present invention can be used for the deposition of magnetic material films, thin films used to manufacture opt-isolators, thin films for optical switch devices, etc.

EXAMPLES

Hereinafter, the present invention will be described in detail with reference to Examples and Comparative Examples, which however shall not be construed as limiting the invention thereto. Note that Examples 1 to 15 and 34 are directed to the first embodiment (a sputtering target containing Bi and Fe (as main ingredients) and having a packing density of greater than 96%) and Examples 16 to 33 and 35 to 39 are directed to the second embodiment (a sputtering target containing Bi and Fe and having a specific resistance of 10 Ωcm or less).

Example 1

Powders of $Bi_2O_3$ and $Fe_2O_3$ were mixed so that the atomic ratio of Bi to Fe was 6:5, followed by dry-mixing in a ball mill for 1 hour. The resultant powder mixture was molded by application of 100-200 MPa pressure and firing in Ar gas at 810° C. for 5 hours to prepare a target which is 200 mm in diameter and 4 mm in thickness. The target was then bonded to a backing plate made of oxygen-free copper by metal bonding to produce Sputtering Target A. Sputtering Target A had a packing density of 97% and a specific resistance of not less than 1,000 Ωcm. Since the packing density is greater than 96% as described above, mass production of optical recording media can be realized while achieving excellent reproducibility.

Example 2

Using Sputtering Target A prepared in Example 1 as a material of recording layer, recordable optical recording media with a layer structure shown in FIG. 1 were manufactured.

More specifically, on a polycarbonate substrate 11 provided with a groove (groove depth=21 nm, track pitch=0.43 μm, not shown), an under layer 12 of 15 nm thickness consisting of $Al_2O_3$, a recording layer 13 of 13 nm thickness consisting of BiFeO, an upper layer 14 of 20 nm thickness consisting of ZnS—$SiO_2$ (mole ratio=80:20), and a reflective layer 15 of 100 nm thickness consisting of AlTi (Ti=1 wt %) were sequentially formed by sputtering. On the reflective layer 15, a protective layer 16 of about 5 μm thickness made of ultraviolet ray-curable resin (A081, acrylic resin produced by NIPPON KAYAKU Co., Ltd.) was formed by spin coating to obtain a recordable optical recording medium. For the sputtering, a DVD sprinter apparatus manufactured by Unaxis was employed.

Note that the "DVD sprinter apparatus manufactured by Unaxis" means a film deposition apparatus named "DVD sprinter" manufactured by Unaxix. In the case of sputtering targets of 76.2 mm diameter, film deposition is conducted using a film deposition apparatus called CFS-8EP-55, and the DVD sprinter manufactured by Unaxis is used for sputtering targets of 200 mm diameter.

Binary recording was made on the optical recording media using an optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s Subsequently, 10 discs were sampled once every 1000 discs, i.e., 1 to 10th, 1001 to 1010th, 2001 to 2010th . . . 9001 to 9010th discs were sampled, and the characteristics (jitter value, modulated amplitude, etc.) of 10 discs of each set were averaged and compared among the different sets.

As a result, for all of the samples, an excellent jitter value of the order of 6% was obtained in a continuously recorded region at a recording power of 6 mW, as measured with a limit equalizer. In addition, such excellent recording/reproducing characteristics were realized that the modulated amplitude of the samples was all 60% or more and the media had a high-to-low polarity. Furthermore, in an evaluation in accordance with the HD DVD-R standard where track pitch on the substrate was set to 0.40 μm, PRSNR was 20 or more and thus remarkably excellent recording/reproducing characteristics were obtained. Note that PRSNR (Partial Response Signal-to-Noise Ratio) is a measure for evaluating signal quality, which is specified in the HD DVD-R standard.

Example 3

Sputtering Target B was obtained in a manner similar to that described in Example 1 except that powders of $Bi_2O_3$ and $Fe_2O_3$ were mixed so that the atomic ratio of Bi to Fe was 2:1. Sputtering Target B had a packing density of 99% and a specific resistance of not less than 1,000 Ωcm. Since the packing density is greater than 96% as described above, mass production of optical recording media can be realized while achieving good reproducibility.

Example 4

Using Sputtering Target B prepared in Example 3 as a material of recording layer, recordable optical recording media with a layer structure shown in FIG. 1 were manufactured.

More specifically, on a polycarbonate substrate 11 provided with a groove (groove depth=21 nm, track pitch=0.43 μm, not shown), an under layer 12 of 15 nm thickness consisting of $Al_2O_3$, a recording layer 13 of 8 nm thickness consisting of BiFeO, an upper layer of 14 nm thickness consisting of ZnS—$SiO_2$ (mole ratio=80:20), and a reflective layer 15 of 100 nm thickness consisting of AlTi (Ti=1 wt %) were sequentially formed by sputtering. On the reflective layer 15, a protective layer 16 of about 5 μm thickness made of ultraviolet ray-curable resin (A081, acrylic resin produced by NIPPON KAYAKU Co., Ltd.) was formed by spin coating to produce a recordable optical recording medium. For the sputtering, the DVD sprinter (manufactured by Unaxis) was employed.

Binary recording was made on the optical recording media using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s Subsequently, 10 discs were sampled once every 1000 discs, i.e., 1 to 10th, 1001 to 1010th, 2001 to 2010th . . . 9001 to 9010th discs were sampled, and the characteristics (jitter value, modulated amplitude, etc.) of 10 discs of each set were averaged and compared among the different sets.

As a result, for all of the samples, an excellent jitter value of the order of 5% was obtained in a continuously recorded region at a recording power of 5 mW, as measured with a limit equalizer. In addition, such excellent recording/reproducing characteristics were realized that the modulated amplitude of the samples was 65% or more and the media had a high-to-low polarity. Furthermore, in an evaluation in accordance with the HD DVD-R standard where track pitch on the substrate was set to 0.40 μm, PRSNR was 20 and SbER was $4.3\times10^{-6}$, and thus remarkably excellent recording/reproducing characteristics were obtained. Note that SbER (Simulated bit Error Rate) is a value indicating error rate, which is specified in the HD DVD-R standard.

Example 5

Sputtering Target C was obtained in a manner similar to that described in Example 1 except that powders of $Bi_2O_3$ and $Fe_2O_3$ were mixed so that the atomic ratio of Bi to Fe was 1:1. Sputtering Target C had a packing density of 96.5% and a specific resistance of not less than 1,000 Ωcm. Since the packing density is greater than 96% as described above, mass production of optical recording media can be realized while achieving excellent reproducibility.

Example 6

Using Sputtering Target C prepared in Example 5 as a material of recording layer, recordable optical recording media with a layer structure shown in FIG. 1 were manufactured.

More specifically, on a polycarbonate substrate 11 provided with a groove (groove depth=21 nm, track pitch=0.43 μm, not shown), an under layer 12 of 20 nm thickness consisting of $Al_2O_3$, a recording layer 13 of 15 nm thickness consisting of BiFeO, an upper layer 14 of 20 nm thickness consisting of ZnS—$SiO_2$ (mole ratio=80:20), and a reflective layer 15 of 100 nm thickness consisting of AlTi (Ti=1 wt %) were sequentially formed by sputtering. On the reflective layer 15, a protective layer 16 of about 5 μm thickness made of ultraviolet ray-curable resin (A081, acrylic resin produced by NIPPON KAYAKU Co., Ltd.) was formed by spin coating to produce a recordable optical recording medium. For the sputtering, the DVD sprinter (manufactured by Unaxis) was employed.

Binary recording was made on the optical recording media using the optical disc evaluator (DDU-1000 manufactured by Pulstech, wavelength=405 nm, NA: 0.65) under the following condition.

Modulation scheme: 1-7 modulation

Linear density: shortest mark length (2 T)=0.204 μm

Linear speed: 6.61 m/s

Subsequently, 10 discs were sampled once every 1000 discs, i.e., 1 to 10th, 1001 to 1010th, 2001 to 2010th . . . 9001 to 9010th discs were sampled, and the characteristics (jitter value, modulated amplitude, etc.) of 10 discs of each sample set were averaged and compared among different sample sets.

As a result, for all of the samples, an excellent jitter value of the order of 6% was obtained in a continuously recorded region at a recording power of 6 mW, as measured with a limit equalizer. In addition, such excellent recording/reproducing characteristics were realized that the modulated amplitude of the samples was 65% or more and the media had a high-to-low polarity. Furthermore, in an evaluation in accordance with the HD DVD-R standard where track pitch on the substrate was set to 0.40 μm, PRSNR was 20 and SbER was $4.3\times10^{-6}$, and thus remarkably excellent recording/reproducing characteristics were obtained.

Example 7

Powders of Bi and Fe were mixed so that the atomic ratio of Bi to Fe was 2:1, followed by dry-mixing in a ball mill for 1 hour. The resultant powder mixture was molded by hot pressing that involved the application of 100-200 MPa pressure and firing under vacuum at 280° C. for 6 hours to prepare a target which is 200 mm in diameter and 4 mm in thickness. The target was then bonded to a backing plate made of oxygen-free copper by metal bonding to produce Sputtering Target D. Sputtering Target D had a packing density of 97% and a specific resistance of not less than 83 μΩcm. Since the packing density is greater than 96% as described above, mass production of optical recording media can be realized while achieving excellent reproducibility.

Example 8

Using Sputtering Target D prepared in Example 7 as a material of recording layer, recordable optical recording media with a layer structure shown in FIG. 1 were manufactured.

More specifically, on a polycarbonate substrate 11 provided with a groove (groove depth=21 nm, track pitch=0.43 μm, not shown), an under layer 12 of 15 nm thickness consisting of $Al_2O_3$, a recording layer 13 of 8 nm thickness consisting of BiFeO, an upper layer 14 of 14 nm thickness consisting of ZnS—$SiO_2$ (mole ratio 80:20), and a reflective layer 15 of 100 nm thickness consisting of AlTi (Ti=1 wt %) were sequentially formed by sputtering. On the reflective layer 15, a protective layer 16 of about 5 μm thickness made of ultraviolet ray-curable resin (A081, acrylic resin produced by NIPPON KAYAKU Co., Ltd.) was formed by spin coating to produce a recordable optical recording medium. For the sputtering, a DVD sprinter apparatus manufactured by Unaxis was employed. The deposition of the BiFeO recording layer was carried out in a mixture gas of Ar and oxygen (Ar flow rate=40 sccm, oxygen flow rate=1 sccm).

Binary recording was then made on the optical recording media using the optical disc evaluator (DDU-1000 manufactured by Pulstech, wavelength=405 nm, NA: 0.65) under the following condition.

Modulation scheme: 1-7 modulation

Linear density: shortest mark length (2 T)=0.204 μm

Linear speed: 6.61 m/s

Subsequently, 10 discs were sampled once every 1000 discs, i.e., 1 to 10th, 1001 to 1010th, 2001 to 2010th . . . 9001 to 9010th discs were sampled, and the characteristics (jitter value, modulated amplitude, etc.) of 10 discs of each set were averaged and compared among the different sets.

As a result, for all of the samples, an excellent jitter value of the order of 5% was obtained in a continuously recorded region at a recording power of 5 mW, as measured with a limit equalizer. In addition, such excellent recording/reproducing characteristics were realized that the modulated amplitude of the samples was 65% or more and the media had a high-to-low polarity. Furthermore, in an evaluation in accordance with the HD DVD-R standard where track pitch on the substrate was set to 0.40 μm, PRSNR was 20 and SbER was $4.3\times10^{-6}$, and thus remarkably excellent recording/reproducing characteristics were obtained.

Example 9

Figure 3:
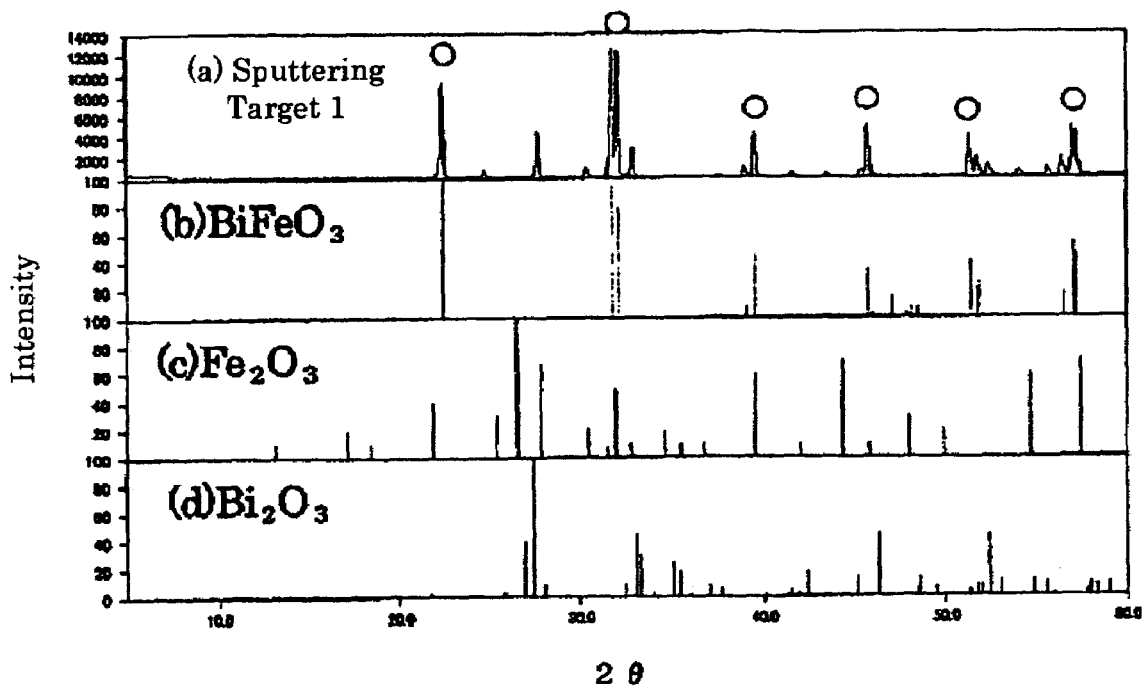
FIG. 3 is an X-ray diffraction spectrum of Sputtering Target 1.

Powders of $Bi_2O_3$ and $\alpha$-$Fe_2O_3$ were mixed so that the atomic ratio of Bi to Fe was 2:1, followed by dry-mixing in a ball mill for 1 hour. The resultant powder mixture was molded by application of 100-200 MPa pressure and firing in the air at 750° C. for 5 hours to prepare a target which is 76.2 mm in diameter and 4 mm in thickness. The target was then bonded to a backing plate made of oxygen-free copper by metal bonding to produce Sputtering Target 1. Sputtering Target 1 had a packing density of 99% and a specific resistance of not less than 1,000 Ωcm. Since the packing density is greater than 96% as described above, mass production of optical recording media can be realized while achieving good reproducibility. The X-ray diffraction spectrum of this sputtering target was measured under the condition shown in Table 1. The X-ray diffraction spectrum is shown in FIG. 3.

The diffraction peaks obtained in the measurement were checked against those of known materials for identification. The spectrum (a) at the top of FIG. 3 is the X-ray diffraction spectrum of Sputtering Target 1, and the spectrum (b) below (a) is a spectrum in which the positions where diffraction peaks of $BiFeO_3$ emerge are shown using a known material. A database of X-ray diffraction spectra of many different known materials has been constructed by collecting past measurement data, telling where the diffraction lines of material emerge and how intense they are. Query into this database can identify the analyte.

By comparing the diffraction peaks of the spectrum (a) with those of the spectrum (b), a diffraction spectrum of $BiFeO_3$, it was established that the peaks above which a ring is put correspond to the peaks of the spectrum (b).

The spectrum (c) is a know spectrum of $\alpha$-$Fe_2O_3$ and the spectrum (d) is a known spectrum of $Bi_2O_3$, and they were similarly compared with the spectrum (a). However, no distinct peaks were observed in the spectrum (a) that seem to correspond to the peaks of $\alpha$-$Fe_2O_3$ and $Bi_2O_3$.

As a result, it was established that major peaks observed in the spectrum (a) correspond to the peaks of $BiFeO_3$ and that this compound is mainly present in Sputtering Target 1.

TABLE 1

| | |
|---|---|
| Beam Source | Cu |
| Wavelength | 1.54056 angstrom |
| Monochometer | Used |
| Tube Current | 100 mA |
| Tube Voltage | 40 kV |
| Data Range | 5-60 deg |
| Scan Axis | 2θ/θ |
| Sampling Interval | 0.020 deg |
| Scan rate | 8.000 deg/min |
| Diverging Slit | 1.00 deg |
| Scattering Slit | 1.00 deg |
| Receiving Slit | 0.15 mm |

Example 10

An optical recording medium was manufactured using the sputtering target prepared in Example 9.

More specifically, on a polycarbonate substrate provided with a groove (groove depth=21 nm, track pitch=0.43 μm), an $Al_2O_3$ layer of 15 nm thickness, a BiFeO layer of 13 nm thickness, a ZnS—$SiO_2$ layer of 20 nm thickness, and an AlTi (Ti=1 wt %) layer of 100 nm thickness were sequentially formed by sputtering. On the AlTi layer, a protective layer of about 5 μm thickness made of ultraviolet ray-curable resin (Nopcocure 134 produced by SAN NOPCO LIMITED) was formed by spin coating to produce a recordable optical recording medium. The sputtering process was carried out using CFS-8EP-55, a sputtering apparatus manufactured by SHIBAURA MECAHTRONICS CORPORATION, under the following sputtering condition: Ar flow rate=40 sccm, power=100 W. There is provided a magnet for magnetron sputtering at the backside of the backing plate made of oxygen-free copper on which the sputtering target is bonded. The deposition of the BiFeO layer was performed by RF magnetron sputtering.

Binary recording was made on the optical recording medium using the optical disc evaluator (DDU-1000 manufactured by Pulstech, wavelength=405 nm, NA: 0.65) under the following condition:

Modulation scheme: 1-7 modulation
Linear density: shortest mark length (2 T)=0.204 μm
Linear speed: 6.61 m/s As a result, an excellent jitter value of 6.2% was obtained in a continuously recorded region at a recording power of 6.4 mW, as measured with a limit equalizer. In addition, such excellent recording/reproducing characteristics were realized that the modulated amplitude was 62% and the medium had a high-to-low polarity. Furthermore, in an evaluation in accordance with the HD DVD-R standard where track pitch on the substrate was set to 0.40 μm, PRSNR was 23 and SbER was $5.8 \times 10^{-7}$, and thus remarkably excellent recording/reproducing characteristics were obtained. Note that PRSNR is a measure for evaluating signal quality and SbER is a value indicating error rate, both of which are specified in the HD DVD-R standard.

Example 11

Powders of $Bi_2O_3$ and $\alpha$-$Fe_2O_3$ were mixed with powders of Bi and Fe so that the atomic ratio of Bi to Fe was 1:1, followed by dry-mixing in a ball mill for 1 hour. The powder mixture was then fired at 800° C. for 5 hours, and X-ray diffraction analysis on the resultant powder revealed the presence of $BiFeO_3$ powder.

Meanwhile, powders of $Bi_2O_3$ and $\alpha$-$Fe_2O_3$ were mixed with powders of Bi and Fe so that the atomic ratio of Bi to Fe was 25:1 followed by dry-mixing in a ball mill for 1 hour. The powder mixture was then fired at 800° C. for 5 hours, and X-ray diffraction analysis on the resultant powder revealed the presence of $Bi_{25}FeO_{40}$ powder.

The two different powders thus obtained were mixed in a mole ratio of 23:1 followed by dry mixing in a ball mill for 1 hour. The resultant powder mixture was molded by hot pressing that involved the application of 100-200 MPa pressure and firing in the air at 900° C. for 3 hours to prepare a target which is 76.2 mm in diameter and 4 mm in thickness. The target was then bonded to a backing plate made of oxygen-free copper by metal bonding to produce Sputtering Target 2. Sputtering Target 2 had a packing density of 97% and a specific resistance of not less than 1,000 Ωcm. Since the packing density is greater than 96% as described above, mass production of optical recording media can be realized while achieving good reproducibility.

Example 12

An optical recording medium was manufactured in a manner similar to that described in Example 10 except that Sputtering Target 2 prepared in Example 11 was used, and binary recording was made on the optical recording medium.

As a result, an excellent jitter value of 5.9% was obtained in a continuously recorded region at a recording power of 6.1 mW, as measured with a limit equalizer. In addition, such excellent recording/reproducing characteristics were realized that the modulated amplitude was 62% and the medium had a high-to-low polarity. Furthermore, in an evaluation in accordance with the HD DVD-R standard where track pitch on the substrate was set to 0.40 μm, PRSNR was 21 and SbER was $2.1 \times 10^{-6}$, and thus remarkably excellent recording/reproducing characteristics were obtained.

Example 13

Powders of $Bi_2O_3$ and $\alpha$-$Fe_2O_3$ were mixed so that the atomic ratio of Bi to Fe was 6:5, followed by dry-mixing in a ball mill for 1 hour. The resultant powder mixture was molded by application of 100-200 MPa pressure and firing in the air at 750° C. for 5 hours to prepare a target which is 200 mm in diameter and 6 mm in thickness. The target was then bonded to a backing plate made of oxygen-free copper by metal bonding to produce Sputtering Target 3. Sputtering Target 3 had a packing density of 99% and a specific resistance of not less than 1,000 Ωcm. Since the packing density is greater than 96% as described above, mass production of optical recording media can be realized while achieving good reproducibility.

Example 14

An optical recording medium was manufactured using Sputtering Target 3 prepared in Example 13.

More specifically, on a polycarbonate substrate provided with a groove (groove depth=21 nm, track pitch=0.43 μm), an $Al_2O_3$ layer of 10 nm thickness, a BiFeO layer of 13 nm thickness, a ZnS—$SiO_2$ layer of 20 nm thickness, and a Ag layer of 100 nm thickness were sequentially formed by sputtering. On the Ag layer, a protective layer of about 5 μm thickness made of ultraviolet ray-curable resin (Nopcocure 134 produced by SAN NOPCO LIMITED) was formed by spin coating to produce a recordable optical recording medium. The sputtering process was carried out using the DVD sprinter (manufactured by UNAXIS) under the following sputtering condition: Ar flow rate=20 sccm, power=1.2 kW. There is provided a magnet for magnetron sputtering at the backside of the backing plate made of oxygen-free copper on which the sputtering target is bonded. The deposition of the BiFeO layer was performed by RF magnetron sputtering.

Binary recording was then made on the optical recording medium as in Example 10.

As a result, an excellent jitter value of 5.5% was obtained in a continuously recorded region at a recording power of 8.8 mW, as measured with a limit equalizer. In addition, such excellent recording/reproducing characteristics were realized that the modulated amplitude was 55% and the medium had a high-to-low polarity. Furthermore, in an evaluation in accordance with the HD DVD-R standard where track pitch on the substrate was set to 0.40 μm, PRSNR was 33 and SbER was $9.6 \times 10^{-10}$, and thus remarkably excellent recording/reproducing characteristics were obtained.

Example 15

Figure 4:
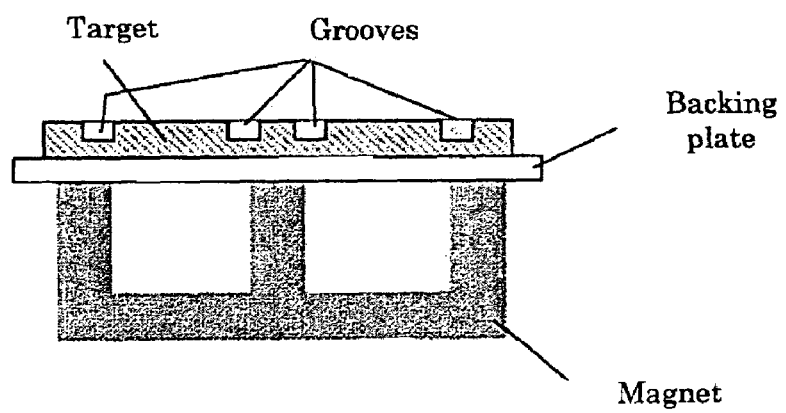
FIG. 4 shows a sputtering target provided with grooves on its surface.

Powders of $Bi_2O_3$ and $Fe_2O_3$ were mixed so that the atomic ratio of Bi to Fe was 2:1, followed by dry-mixing in a ball mill for 1 hour. The resultant powder mixture was molded by hot pressing that involved the application of 100-200 MPa pressure and firing in the air at 780° C. for 5 hours followed by the formation of grooves as shown in FIG. 4, preparing a target which is 200 mm in diameter and 6 mm in thickness. The target thus obtained was then bonded to a backing plate made of oxygen-free copper by metal bonding to manufacture a sputtering target, which had a packing density of 97% and a specific resistance of not less than 1,000 Ωcm. Since the specific resistance is high, radio-frequency sputtering was adopted for film deposition. The sputtering target had a packing density of greater than 96%, magnetron sputtering can be performed with efficiency, and plasma discharge is stable during film deposition. Thus, mass production of optical recording media can be realized while achieving good reproducibility.

Comparative Example 1

A sputtering target was prepared in a manner similar to that described in Example 1 except that powders of $Bi_2O_3$ and $Fe_2O_3$ were mixed so that the atomic ratio of Bi to Fe was 2:5. The sputtering target had a packing density of 94% and specific resistance of not less than 1,000 Ωcm.

Recordable optical recording media were manufactured as in Example 2 using this sputtering target.

Binary recording was then made on the optical recording media as in Example 2, and 10 discs were sampled every 1000 discs and characteristic evaluation was made for each set of 10 discs. It was found that in 2000th and subsequent discs, the PRSN value was less than 20 in a continuously recorded region.

Since the packing density of the sputtering target is not greater than 96%, it is not possible to manufacture optical recording media in large quantities with excellent reproducibility.

Comparative Example 2

A sputtering target was prepared in a manner similar to that described in Example 1 except that powders of $Bi_2O_3$ and $Fe_2O_3$ were mixed so that the atomic ratio of Bi to Fe was 3:5. The sputtering target had a packing density of 95%.

Recordable optical recording media were manufactured as in Example 2 using this sputtering target.

Binary recording was then made on the optical recording media as in Example 2, and 10 discs were sampled every 1000 discs and characteristic evaluation was made for each set of 10 discs. It was found that in 3000th and subsequent discs, the PRSN value was less than 20 in a continuously recorded region.

Since the packing density of the sputtering target is not greater than 96%, it is not possible to manufacture optical recording media in large quantities with excellent reproducibility.

Example 16

Powders of Bi and $Fe_2O_3$ were mixed so that the atomic ratio of Bi to Fe was 2:1, followed by dry-mixing in a ball mill for 1 hour. The resultant powder mixture was molded by hot pressing that involved the application of 100-200 MPa pressure and firing in Ar gas at 270° C. for 5 hours to prepare a target which is 76.2 mm in diameter and 4 mm in thickness. The target was then bonded to a backing plate made of oxygen-free copper by metal bonding to manufacture a sputtering target. The sputtering target had a packing density of 91% and a specific resistance of 4 mΩcm.

Example 17

An optical recording medium was manufactured using the sputtering target prepared in Example 16.

On a polycarbonate substrate provided with a groove (groove depth=21 nm, track pitch=0.43 μm), an under layer of 15 nm thickness consisting of $Al_2O_3$, a recording layer of 13 nm thickness consisting of BiFeO, an upper layer of 20 nm thickness consisting of ZnS—$SiO_2$ (mole ratio=80:20), and a reflective layer of 100 nm thickness consisting of AlTi (Ti=1 wt %) were sequentially formed by sputtering. On the AlTi layer, a protective layer of about 5 μm thickness made of ultraviolet ray-curable resin (Nopcocure 134 produced by SAN NOPCO LIMITED) was formed by spin coating to produce a recordable optical recording medium. The sputtering process was carried out using CFS-8EP-55, a sputtering apparatus manufactured by SHIBAURA MECAHTRONICS CORPORATION. The deposition of the BiFeO film was performed by direct-current sputtering in a mixture gas of Ar and oxygen (Ar flow rate=40 sccm, oxygen flow rate=2 sccm).

Binary recording was then made on the optical recording medium using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s As a result, an excellent jitter value of 6.2% was obtained in a continuously recorded region at a recording power of 6.4 mW, as measured with a limit equalizer. In addition, such excellent recording/reproducing characteristics were realized that the modulated amplitude was 62% and the medium had a high-to-low polarity. Furthermore, in an evaluation in accordance with the HD DVD-R standard where track pitch on the substrate was set to 0.40 μm, PRSNR was 23 and SbER was $5.8 \times 10^{-7}$, and thus remarkably excellent recording/reproducing characteristics were obtained.

Example 18

Powders of Bi and Fe were mixed so that the atomic ratio of Bi to Fe was 2:1, followed by dry-mixing in a ball mill for 1 hour. The resultant powder mixture was molded by hot pressing that involved the application of 100-200 MPa pressure and firing under vacuum at 270° C. for 5 hours to prepare a target which is 76.2 mm in diameter and 4 mm in thickness. The target was then bonded to a backing plate made of oxygen-free copper by metal bonding to manufacture a sputtering target. This sputtering target had a packing density of 93% and a specific resistance of 83 μΩcm.

Example 19

An optical recording medium was manufactured using the sputtering target prepared in Example 18.

On a polycarbonate substrate provided with a groove (groove depth=21 nm, track pitch=0.43 μm, not shown), an under layer of 15 nm thickness consisting of $Al_2O_3$, a recording layer of 8 nm thickness consisting of BiFeO, an upper layer of 14 nm thickness consisting of ZnS—$SiO_2$ (mole ratio=80:20), and a reflective layer of 100 nm thickness consisting of AlTi (Ti=1 wt %) were sequentially formed by sputtering. On the AlTi layer, a protective layer of about 5 μm thickness made of ultraviolet ray-curable resin (Nopcocure 134 produced by SAN NOPCO LIMITED) was formed by spin coating to produce a recordable optical recording medium. The sputtering process was carried out using CFS-8EP-55, a sputtering apparatus manufactured by SHIBAURA MECAHTRONICS CORPORATION. The deposition of the BiFeO film was performed by direct-current sputtering in a mixture gas of Ar and oxygen (Ar flow rate=40 sccm, oxygen flow rate=1 sccm).

Binary recording was then made on the optical recording medium using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s As a result, an excellent jitter value of 5.2% was obtained in a continuously recorded region at a recording power of 5.6 mW, as measured with a limit equalizer. In addition, such excellent recording/reproducing characteristics were realized that the modulated amplitude was 65% and the medium had a high-to-low polarity. Furthermore, in an evaluation in accordance with the HD DVD-R standard where track pitch on the substrate was set to 0.40 μm, PRSNR was 19 and SbER was $4.3 \times 10^{-6}$, and thus remarkably excellent recording/reproducing characteristics were obtained.

Example 20

Powders of $Bi_2O_3$ and Fe were mixed so that the atomic ratio of Bi to Fe was 15:5, followed by dry-mixing in a ball mill for 1 hour. The resultant powder mixture was molded by hot pressing that involved the application of 100-200 MPa pressure and firing in Ar gas at 780° C. for 3 hours to prepare a target which is 76.2 mm in diameter and 4 mm in thickness. The target was then bonded to a backing plate made of oxygen-free copper by metal bonding to manufacture a sputtering target. This sputtering target had a packing density of 95% and a specific resistance of 0.8 Ωcm.

Example 21

An optical recording medium was manufactured using the sputtering target prepared in Example 20.

On a polycarbonate substrate provided with a groove (groove depth=21 nm, track pitch=0.43 μm), an under layer of 15 nm thickness consisting of $Al_2O_3$, a recording layer of 5 nm thickness consisting of BiFeO, an upper layer of 20 nm thickness consisting of ZnS—$SiO_2$ (mole ratio=80:20), and a reflective layer of 100 nm thickness consisting of AlTi (Ti=1 wt %) were sequentially formed by sputtering. On the AlTi layer, a protective layer of about 5 μm thickness made of ultraviolet ray-curable resin (Nopcocure 134 produced by SAN NOPCO LIMITED) was formed by spin coating to produce a recordable optical recording medium. The sputtering process was carried out using CFS-8EP-55, a sputtering apparatus manufactured by SHIBAURA MECAHTRONICS CORPORATION. The deposition of the BiFeO film was performed by direct-current sputtering in a mixture gas of Ar and oxygen (Ar flow rate=40 sccm, oxygen flow rate=2 sccm).

Binary recording was then made on the optical recording medium using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s As a result, an excellent jitter value of 6.5% was obtained in a continuously recorded region at a recording power of 5.8 mW, as measured with a limit equalizer. In addition, such excellent recording/reproducing characteristics were realized that the modulated amplitude was 66% and the medium had a high-to-low polarity. Furthermore, in an evaluation in accordance with the HD DVD-R standard where track pitch on the substrate was set to 0.40 μm, PRSNR was 21 and SbER was $2.1 \times 10^{-6}$, and thus remarkably excellent recording/reproducing characteristics were obtained.

Example 22

Powders of $Bi_2O_3$, $Fe_2O_3$ and $In_2O_3$ were mixed so that the atomic ratio Bi:Fe:In was 10:1:6 and ethanol was added, followed by wet-mixing in a ball mill for 1 hour. The resultant powder mixture was molded by hot pressing that involved the application of 50-100 MPa pressure and firing under vacuum at 780° C. for 5 hours to prepare a target which is 76.2 mm in diameter and 4 mm in thickness. The target was then bonded to a backing plate made of oxygen-free copper by metal bonding to obtain a sputtering target. This sputtering target had a packing density of 94% and a specific resistance of 8.4 Ωcm.

Example 23

An optical recording medium was manufactured using the sputtering target prepared in Example 22.

On a polycarbonate substrate provided with a groove (groove depth=21 nm, track pitch=0.43 μm), an under layer of 15 nm thickness consisting of $Al_2O_3$, a recording layer of 13 nm thickness consisting of BiFeInO, an upper layer of 20 nm thickness consisting of ZnS—$SiO_2$ (mole ratio=80:20), and a reflective layer of 100 nm thickness consisting of AlTi (Ti=1 wt %) were sequentially formed by sputtering. On the AlTi layer, a protective layer of about 5 μm thickness made of ultraviolet ray-curable resin (Nopcocure 134 produced by SAN NOPCO LIMITED) was formed by spin coating to produce a recordable optical recording medium. The sputtering process was carried out using CFS-8EP-55, a sputtering apparatus manufactured by SHIBAURA MECAHTRONICS CORPORATION. The deposition of the BiFeInO film was performed by direct-current sputtering in a mixture gas of Ar and oxygen (Ar flow rate=40 sccm, oxygen flow rate=4 sccm).

Binary recording was then made on the optical recording medium using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s As a result, an excellent jitter value of 5.8% was obtained in a continuously recorded region at a recording power of 6.2 mW, as measured with a limit equalizer. In addition, such excellent recording/reproducing characteristics were realized that the modulated amplitude was 60% and the medium had a high-to-low polarity. Furthermore, in an evaluation in accordance with the HD DVD-R standard where track pitch on the substrate was set to 0.40 μm, PRSNR was 27 and SbER was $1.1 \times 10^{-8}$, and thus remarkably excellent recording/reproducing characteristics were obtained.

Example 24

Powders of $Bi_2O_3$, $Fe_2O_3$, ZnO and $In_2O_3$ were mixed so that the atomic ratio Bi:Fe:Zn:In was 10:1:1:5 and ethanol was added, followed by wet-mixing in a ball mill for 1 hour. The resultant powder mixture was molded by hot pressing that involved the application of 50-100 MPa pressure and firing under vacuum at 780° C. for 5 hours to prepare a target which is 76.2 mm in diameter and 4 mm in thickness. The target was then bonded to a backing plate made of oxygen-free copper by metal bonding to obtain a sputtering target. This sputtering target had a packing density of 93% and a specific resistance of 0.02 Ωcm.

Example 25

An optical recording medium was manufactured using the sputtering target prepared in Example 24.

On a polycarbonate substrate provided with a groove (groove depth=21 nm, track pitch=0.43 μm), an under layer of 15 nm thickness consisting of $Al_2O_3$, a recording layer of 13 nm thickness consisting of BiFeZnInO, an upper layer of 20 nm thickness consisting of ZnS—$SiO_2$ (mole ratio=80:20), and a reflective layer of 100 nm thickness consisting of AlTi (Ti=1 wt %) were sequentially formed by sputtering. On the AlTi layer, a protective layer of about 5 μm thickness made of ultraviolet ray-curable resin (Nopcocure 134 produced by SAN NOPCO LIMITED) was formed by spin coating to obtain a recordable optical recording medium. The sputtering process was carried out using CFS-8EP-55, a sputtering apparatus manufactured by SHIBAURA MECAHTRONICS CORPORATION. The deposition of the BiFeZnInO film was performed by direct-current sputtering in a mixture gas of Ar and oxygen (Ar flow rate=40 sccm, oxygen flow rate=4 sccm).

Binary recording was then made on the optical recording medium using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s As a result, an excellent jitter value of 5.8% was obtained in a continuously recorded region at a recording power of 6.2 mW, as measured with a limit equalizer. In addition, such excellent recording/reproducing characteristics were realized that the modulated amplitude was 60% and the medium had a high-to-low polarity. Furthermore, in an evaluation in accordance with the HD DVD-R standard where track pitch on the substrate was set to 0.40 μm, PRSNR was 26 and SbER was $9.1 \times 10^{-8}$, and thus remarkably excellent recording/reproducing characteristics were obtained.

Example 26

Powders of $Bi_2O_3$, $Fe_2O_3$ and carbon were mixed so that the atomic ratio Bi:Fe:C was 10:5:3, ethanol was added, and wet-mixed in a ball mill for 1 hour. The resultant powder mixture was molded by hot pressing that involved the application of 50-100 MPa pressure and firing in Ar gas at 810° C. for 5 hours to prepare a target which is 76.2 mm in diameter and 4 mm in thickness. The target was then bonded to a backing plate made of oxygen-free copper by metal bonding to obtain a sputtering target. This sputtering target had a packing density of 92% and a specific resistance of 1.3 mΩcm.

Example 27

An optical recording medium was manufactured using the sputtering target prepared in Example 26.

On a polycarbonate substrate provided with a groove (groove depth=21 nm, track pitch=0.43 μm), an under layer of 10 nm thickness consisting of $Al_2O_3$, a recording layer of 13 nm thickness consisting of BiFeO, an upper layer of 20 nm thickness consisting of ZnS—$SiO_2$ (mole ratio=80:20), and a reflective layer of 100 nm thickness consisting of AlTi (Ti=1 wt %) were sequentially formed by sputtering. On the AlTi layer, a protective layer of about 5 μm thickness made of ultraviolet ray-curable resin (Nopcocure 134 produced by SAN NOPCO LIMITED) was formed by spin coating to obtain a recordable optical recording medium. The sputtering process was carried out using CFS-8EP-55, a sputtering apparatus manufactured by SHIBAURA MECAHTRONICS CORPORATION. The deposition of the BiFeO film was performed by direct-current sputtering in a mixture gas of Ar and oxygen (Ar flow rate=40 sccm, oxygen flow rate=2 sccm).

Binary recording was then made on the optical recording medium using the optical disc evaluator (DDU-1000 manufactured by Pulstech, wavelength=405 nm, NA: 0.65) under the following condition.

Modulation scheme: 1-7 modulation
Linear density: shortest mark length (2 T)=0.204 μm
Linear speed: 6.61 m/s As a result, an excellent jitter value of 5.9% was obtained in a continuously recorded region at a recording power of 6.5 mW, as measured with a limit equalizer. In addition, such excellent recording/reproducing characteristics were realized that the modulated amplitude was 60% and the medium had a high-to-low polarity. Furthermore, in an evaluation in accordance with the HD DVD-R standard where track pitch on the substrate was set to 0.40 μm, PRSNR was 24 and SbER was $9.1 \times 10^{-8}$, and thus remarkably excellent recording/reproducing characteristics were obtained.

Example 28

Sputtering targets were prepared in a manner similar to that described in Example 18, with the Bi proportion changed to those in Table 2 below. The sputtering target with a Bi proportion of 17 atomic % had a packing density of 97% and a specific resistance of 27.68 μΩcm; one with a Bi proportion of 28.6 atomic % had a packing density of 90% and a specific resistance of 39.89 μΩcm; one with a Bi proportion of 37.5 atomic % had a packing density of 85% and a specific resistance of 49.25 μΩcm; one with a Bi proportion of 44.4 atomic % had a packing density of 81% and a specific resistance of 56.51 μΩcm;

one with a Bi proportion of 50 atomic % had a packing density of 88% and a specific resistance of 62.4 μΩcm; one with a Bi proportion of 54.5 atomic % had a packing density of 91% and a specific resistance of 67.13 μΩcm; one with a Bi proportion of 87.5 atomic % had a packing density of 96% and a specific resistance of 101.85 μΩcm; and one with a Bi proportion of 99 atomic % had a packing density of 99% and a specific resistance of 113.95 μΩcm;

Optical recording media were manufactured using these sputtering targets.

On a polycarbonate substrate provided with a groove (groove depth=50 nm, track pitch=0.46 μm), an under layer of 20 nm thickness consisting of ZnS—SiO$_2$ (mole ratio=80:20) and a recording layer of 10 nm thickness consisting of BiFeO were sequentially formed by sputtering. Thereon, an organic thin film (average film thickness=about 30 nm) made of dye represented by the following General Formula (1) was formed by spin coating. Subsequently, a Ag reflective layer of 150 nm thickness was formed on the organic thin film by sputtering, and a protective layer of about 5 μm thickness made of ultraviolet ray-curable resin (Nopcocure 134 produced by SAN NOPCO LIMITED) was formed thereon by spin coating to obtain a recordable optical recording medium. The sputtering process was carried out using SBH-2306E, a sputtering apparatus manufactured by ULVAC. The deposition of the BiFeO film was performed by direct-current sputtering in a mixture gas of Ar and oxygen (Ar flow rate=40 sccm, oxygen flow rate=0.8 sccm).

General Formula (1)

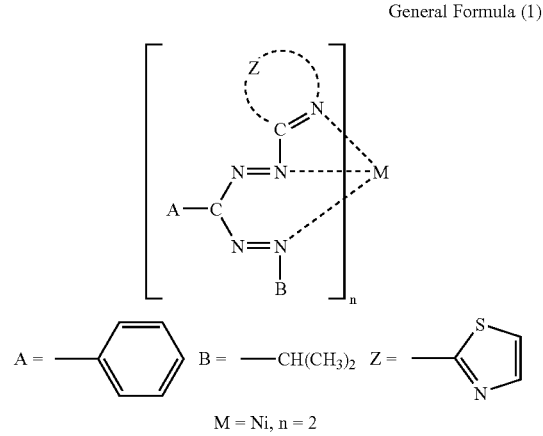

General Formula (1)

M = Ni, n = 2

Binary recording was then made on the optical recording medium using the optical disc evaluator (DDU-1000 manufactured by Pulstech, wavelength=405 nm, NA: 0.65) under the following condition.

Figure 2:
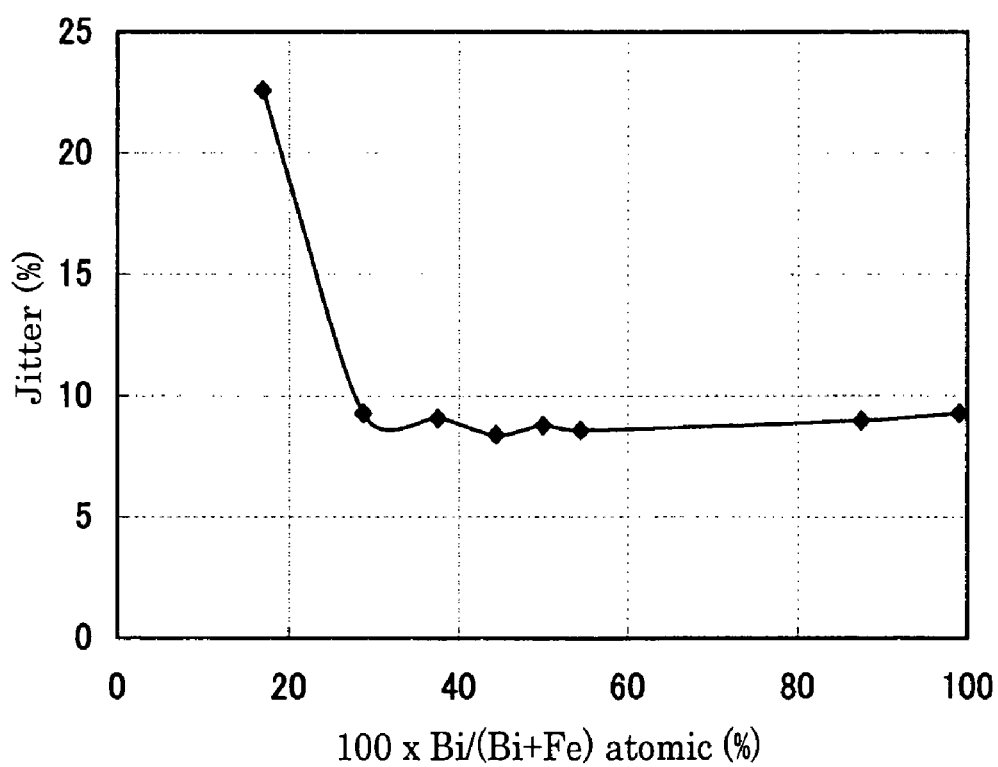
FIG. 2 is a graph of proportion of Bi (atomic %) in each sputtering target vs. jitter value in Example 28.

Modulation scheme: 8-16 modulation
Linear density: shortest mark length (3 T)=0.275 μm
Linear speed: 6.0 m/s The recording power (Pw), the Bi proportion (atomic %), or 100×Bi/(Bi+Fe), in each sputtering target, and the jitter value of each medium as measured with a normal equalizer, are all shown in Table 2. In addition, the relationship between Bi proportion and jitter value is shown in FIG. 2.

Direct-current sputtering can be applied to all sputtering targets prepared in this Example. The jitter value become reduced when the Bi proportion is about 28 atomic % or more, remains almost constant with increasing Bi proportion, and remains low even when the Bi proportion is 99 atomic %. Meanwhile, a recordable optical recording medium manufactured using a Bi sputtering target showed a jitter value of 9.2% when written. The net result of these facts is that a preferable Bi range from the view point of jitter is such that 0.28≦Bi/(Bi+Fe).

Although sputtering targets consisting of Bi and Fe were used in this Example, the same tendency is also seen in sputtering targets that contain Bi, Fe, O and a substance for imparting conductivity and in sputtering targets that contain Bi and Fe, or Bi, Fe and O, and contain a compound where oxygen is reduced compared to the stoichiometric composition.

TABLE 2

| 100 × Bi/(Bi + Fe) (atomic %) | Jitter (%) | Pw (mW) |
|---|---|---|
| 17 | 22.6 | 8.1 |
| 28.6 | 9.3 | 8.2 |
| 37.5 | 9.1 | 8 |
| 44.4 | 8.4 | 8 |
| 50 | 8.8 | 8.6 |
| 54.5 | 8.6 | 8.8 |
| 87.5 | 9 | 7.9 |
| 99 | 9.3 | 6.6 |

Example 29

Powders of $Bi_2O_3$, Bi and $Fe_3O_4$ were mixed in a mole ratio of 21:18:10, followed by dry-mixing in a ball mill for 1 hour. The resultant powder mixture was molded by hot pressing that involved the application of 100-200 MPa pressure and firing under vacuum at 270° C. for 5 hours to prepare a target which is 76.2 mm in diameter and 4 mm in thickness. The sputtering target was then bonded to a backing plate made of oxygen-free copper by metal bonding to obtain a sputtering target. In a similar way, sputtering targets with different powder ratios were manufactured, and their packing densities, specific resistances, etc., are shown in Table 3.

BiFeO recording layers were deposited by direct-current sputtering of these sputtering targets in a mixture gas of Ar and oxygen (the flow rate ratio of Ar to oxygen=40:0.8).

Although direct-current sputtering was possible for the sputtering targets with a specific resistance of about 1-10 $\Omega$cm, film deposition failed at a high direct-current power level due to the occurrence of abnormal discharge. Normal discharge was possible at a low power level, however, the current resisted flowing with increasing time, resulting in abnormal discharge. By contrast, for the sputtering targets with a specific resistance of as low as 0.1-1 $\Omega$cm, no abnormal discharge occurred that causes discharge failure, and thus continuous film deposition was made possible. During sputtering of the sputtering targets with a specific resistance of 0.1 $\Omega$cm or less, no abnormal discharge occurred at all.

density is greater than 96% as described above, mass production of optical recording media can be realized while achieving good reproducibility.

A recording layer was deposited using this sputtering target and an optical recording medium was manufactured. This optical recording medium offered such excellent characteristics that jitter value was 9.6.

Example 31

Powders of Bi, Fe and Al were mixed so that the atomic ratio Bi:Fe:Al was 1:5:94, followed by followed by dry-mixing in a ball mill for 1 hour. The resultant powder mixture was molded by hot pressing that involved the application of 100-200 MPa pressure and firing under vacuum at 600° C. for 5 hours to prepare a target which is 76.2 mm in diameter and 4 mm in thickness. The target was then bonded to a backing plate made of oxygen-free copper by metal bonding to obtain a sputtering target. This sputtering target had a packing density of 78% and a specific resistance of about 5 $\mu\Omega$cm.

An optical recording medium was manufactured as in Example 16 using this sputtering target for the deposition of

TABLE 3

| Mixing ratio (mole ratio) | | | Packing density | Specific resistance | Direct current power | | Film deposition |
|---|---|---|---|---|---|---|---|
| $Bi_2O_3$ | Bi | $Fe_3O_4$ | (%) | ($\Omega$cm) | 400 W | 100 W | continuity |
| 27 | 6 | 10 | 91 | 3.9 | Abnormal discharge (Film deposition failed) | Film deposition succeeded | Arc discharge increased with time |
| 21 | 18 | 10 | 96 | 0.68 | Abnormal discharge (Film deposition failed) | Film deposition succeeded | Abnormal discharge (film deposition succeeded) |
| 6 | 18 | 5 | 96 | 0.18 | Film deposition succeeded | — | Infrequent abnormal discharge |
| 3 | 24 | 5 | 98 | 0.098 | Film deposition succeeded | — | No abnormal discharge |
| 0 | 2 | 1 | 99 | 0.0072 | Film deposition succeeded | — | No abnormal discharge |

Example 30

Powders of $Bi_3Ni$ and $FeNi_3$ were mixed so that the atomic ratio of Bi to Fe was 2:5, followed by dry-mixing in a ball mill for 1 hour. The resultant powder mixture was molded by hot pressing that involved the application of 100-200 MPa pressure and firing in argon gas at 450° C. for 10 hours to prepare a target which is 76.2 mm in diameter and 4 mm in thickness. The target was then bonded to a backing plate made of oxygen-free copper by metal bonding to obtain a sputtering target. This sputtering target had a packing density of 98% and a specific resistance of about 10 $\mu\Omega$cm. Since the packing a recording layer, and evaluation was made on this medium. However, little recording signal was obtained due to poor recording sensitivity.

Example 32

In this Example grooves were formed in the target surface as shown in FIG. 4. With this configuration, magnetic flux leakage through these grooves is facilitated and thereby the film deposition by means of magnetron sputtering is made easier.

Powders of $Bi_2O_3$ and $\alpha$-$Fe_2O_3$ were mixed so that the atomic ratio of Bi to Fe was 2:1 and ethanol was added, followed by wet-mixing in a ball mill for 1 hour. The resultant powder mixture was molded by hot pressing that involved the application of 50-100 MPa pressure and firing under vacuum at 810° C. for 5 hours, and grooves were formed in the surface of the fired article to prepare a target which is 76.2 mm in diameter and 4 mm in thickness. The target was then bonded to a backing plate made of oxygen-free copper by metal bonding to obtain a sputtering target. Because sintering was carried out under vacuum, the resultant sputtering target had a packing density of 92% and a specific resistance of 8.5 Ωcm. Because some oxygen was removed, the sputtering target was somewhat ferromagnetic.

Example 33

An optical recording medium was manufactured in a manner similar to that described in Example 14 except that the BiFeO layer was deposited by sputtering of the target prepared in Example 32 in a mixture gas of Ar and oxygen (Ar flow rate=40 sccm, oxygen flow rate=4 sccm), and binary recording was made on the medium.

As a result, an excellent jitter value of 5.2% was obtained in a continuously recorded region at a recording power of 9.8 mW, as measured with a limit equalizer. In addition, such excellent recording/reproducing characteristics were realized that the modulated amplitude was 55% and the medium had a high-to-low polarity. Furthermore, in an evaluation in accordance with the HD DVD-R standard where track pitch on the substrate was set to 0.40 μm, PRSNR was 27 and SbER was $2.3 \times 10^{-8}$, and thus remarkably excellent recording/reproducing characteristics were obtained.

Example 34

Powders of $Bi_2O_3$ and $Fe_2O_3$ were mixed so that the atomic ratio of Bi to Fe was 2:1, followed by dry-mixing in a ball mill for 1 hour. The resultant powder mixture was molded by hot pressing that involved the application of 100-200 MPa pressure and firing in the air at 780° C. for 5 hours to prepare a target which is 200 mm in diameter and 6 mm in thickness. The target was then bonded to a backing plate made of oxygen-free copper by metal bonding to obtain a sputtering target. This sputtering target had a packing density of 97% and a specific resistance of not less than 1,000 Ωcm. Because of high specific resistance, radio-frequency sputtering was employed for film deposition. Since the packing density is greater than 96% as described above, mass production of optical recording media can be realized while achieving good reproducibility.

Example 35

Powders of $Bi_2O_3$ and Fe were mixed so that the atomic ratio of Bi to Fe was 2:1, followed by dry-mixing in a ball mill for 1 hour. The resultant powder mixture was molded by hot pressing that involved the application of 100-300 MPa pressure and firing in Ar gas at 800° C. for 5 hours to prepare a target which is 200 mm in diameter and 6 mm in thickness. The target was then bonded to a backing plate made of oxygen-free copper by metal bonding to manufacture a sputtering target. This sputtering target was deficient in oxygen and had a packing density of 96% and a specific resistance of 6 mΩcm. A BiFeO recording layer was deposited by direct-sputtering in a mixture gas of Ar and oxygen. The film deposition rate in this Example using direct-current sputtering was 1.3 times faster than that in Example 34. In addition, the introduction of oxygen during film deposition made it easier to control the amount of oxygen in the BiFeO recording layer being made, and thus mass production of optical recording media was made possible while achieving good reproducibility. Moreover, a somewhat reduced oxygen amount provided an effect that the optical recording medium showed increased recording sensitivity.

Example 36

Powders of $Bi_2O_3$, $Fe_2O_3$ and carbon were mixed in a mole ratio of 6:1:3, followed by dry-mixing in a ball mill for 1 hour. The resultant powder mixture was molded by hot pressing that involved the application of 100-300 MPa pressure and firing in the air at 800° C. for 5 hours to prepare a target which is 200 mm in diameter and 6 mm in thickness. The target was then bonded to a backing plate made of oxygen-free copper by metal bonding to obtain a sputtering target. This sputtering target had a packing density of 96% and a specific resistance of 7 mΩcm. A recording layer was deposited by direct-current sputtering in Ar gas. There was an effect that recording sensitivity of the resulting optical recording medium was improved because of increased optical absorption of the recording layer.

Example 37

Powders of $Bi_2O_3$, $Fe_2O_3$ and ZnO were mixed in a mole ratio of 6:1:3, followed by dry-mixing in a ball mill for 1 hour. The resultant powder mixture was molded by hot pressing that involved the application of 100-300 MPa pressure and firing in the air at 800° C. for 5 hours to prepare a target which is 200 mm in diameter and 6 mm in thickness. The target was then bonded to a backing plate made of oxygen-free copper by metal bonding to obtain a sputtering target. This sputtering target had a packing density of 99% and a specific resistance of 7 mΩcm. A BiFeZnO recording layer was deposited by direct-current sputtering in Ar gas. The film deposition rate in this Example was 1.7 times faster than that in Example 34, thereby increasing productivity. Since the packing density is greater than 96%, mass production of optical recording media was made possible while achieving good reproducibility. Moreover, there was an effect that recording sensitivity of the resulting optical recording medium was improved because of increased optical absorption of the recording layer.

Example 38

Powders of $Bi_2O_3$, $Fe_2O_3$ and Al were mixed in a ratio mole of 6:2:2, followed by dry-mixing in a ball mill for 1 hour. The resultant powder mixture was molded by hot pressing that involved the application of 100-300 MPa pressure and firing in the air at 600° C. for 5 hours to prepare a target which is 200 mm in diameter and 6 mm in thickness. The target was then bonded to a backing plate made of oxygen-free copper by metal bonding to obtain a sputtering target. This sputtering target had a packing density of 96% and a specific resistance of 3 mΩcm. A recording layer was deposited by direct-current sputtering in a mixture gas of Ar and oxygen.

Example 39

Powders of Bi, $B_2O_3$ and $Fe_2O_3$ were mixed in a mole ratio of 6:3:1, followed by dry-mixing in a ball mill for 1 hour. The resultant powder mixture was molded by hot pressing that involved the application of 100-300 MPa pressure and firing in the air at 270° C. for hours to prepare a target which is 200 mm in diameter and 6 mm in thickness. The target was then bonded to a backing plate made of oxygen-free copper by metal bonding to obtain a sputtering target. This sputtering target had a packing density of 96% and a specific resistance of 10 mΩcm. A recording layer was deposited by direct-current sputtering in a mixture gas of Ar and oxygen.

Comparative Example 3

Powders of $Bi_2O_3$ and $Fe_2O_3$ were mixed so that the atomic ratio of Bi to Fe was 2:1, followed by dry-mixing in a ball mill for 1 hour. The resultant powder mixture was molded by hot pressing that involved the application of 100-200 MPa pressure and firing in the air at 780° C. for 5 hours to prepare a target which is 76.2 mm in diameter and 4 mm in thickness. The target was then bonded to a backing plate made of oxygen-free copper by metal bonding to obtain a sputtering target. This sputtering target had a packing density of 71% and a specific resistance of not less than 1 MΩcm.

Film deposition by direct-sputtering of this sputtering target failed because no plasma discharge occurred.

In addition, since the packing density is not greater than 96%, optical recording media cannot be manufactured in large quantities with excellent reproducibility.

What is claimed is:

1. A sputtering target comprising:
   Bi and Fe,
   wherein the packing density of the sputtering target is greater than 96%, and
   wherein the sputtering target is used for the formation of a recording layer of a recordable optical recording medium.

2. The sputtering target according to claim 1, wherein the sputtering target comprises Bi, Fe, and O, and the packing density of the sputtering target is greater than 96%.

3. A sputtering target comprising:
   Bi and Fe,
   wherein the specific resistance of the sputtering target is 10 Ωcm or less, and
   wherein the sputtering target is used for the formation of a recording layer of a recordable optical recording medium.

4. The sputtering target according to claim 3, wherein the sputtering target comprises Bi, Fe and O, and further comprises a substance for imparting conductivity.

5. The sputtering target according to claim 3, wherein the sputtering target comprises a compound where oxygen is reduced compared to a stoichiometric composition.

6. The sputtering target according to claim 3, wherein among elements other than oxygen, the proportion of Bi is 28 atomic % or more.

7. The sputtering target according to claim 3, wherein the sputtering target comprises at least one of Bi and Fe, both of which are in a metallic state.

8. The sputtering target according to claim 3, wherein the sputtering target comprises at least one metal other than Bi and Fe.

9. The sputtering target according to claim 3, wherein the packing density is greater than 96%.

10. The sputtering target according to claim 1, wherein the sputtering target comprises at least one of a shape, a structure and a composition for allowing a magnetic flux to leak from a target surface side, and wherein magnetron sputtering can be applied.

11. The sputtering target according to claim 10, wherein the sputtering target comprises a non-ferromagnetic compound.

12. The sputtering target according to claim 10, wherein Fe is contained as a ternary compound of BiFeO.

13. The sputtering target according to claim 10, wherein Fe is contained as $\alpha$-$Fe_2O_3$.

14. The sputtering target according to claim 10, wherein the sputtering target comprises a shape for allowing a magnetic flux to leak from the target surface side.

15. A method for manufacturing a sputtering target by means of sintering method,
   wherein the sputtering target is used for the formation of a recording layer of a recordable optical recording medium and comprises Bi and Fe, and the packing density of the sputtering target is greater than 96%.

16. The sputtering target according to claim 1, wherein among the elements the Bi proportion is 28 atomic % or more.

17. The method of claim 15, wherein said sintering method comprises using raw materials including an element that imparts conductivity to the sputtering target.

* * * * *